(12) United States Patent
Feinberg et al.

(10) Patent No.: US 10,191,128 B2
(45) Date of Patent: Jan. 29, 2019

(54) DEVICE AND METHOD FOR LOOPS-OVER-LOOPS MRI COILS

(71) Applicants: David A. Feinberg, Bodega Bay, CA (US); Scott M. Schillak, Minneapolis, MN (US)

(72) Inventors: David A. Feinberg, Bodega Bay, CA (US); Scott M. Schillak, Minneapolis, MN (US)

(73) Assignee: Life Services, LLC, Minneapolis, MN (US)

( * ) Notice: Subject to any disclaimer, the term of this patent is extended or adjusted under 35 U.S.C. 154(b) by 801 days.

(21) Appl. No.: 14/619,051

(22) Filed: Feb. 10, 2015

(65) Prior Publication Data

US 2015/0323624 A1 Nov. 12, 2015

Related U.S. Application Data

(60) Provisional application No. 61/939,255, filed on Feb. 12, 2014.

(51) Int. Cl.
| | | |
|---|---|---|
| *G01V 3/00* | (2006.01) | |
| *G01R 33/3415* | (2006.01) | |
| *G01R 33/36* | (2006.01) | |
| *G01R 33/34* | (2006.01) | |

(52) U.S. Cl.
CPC ... *G01R 33/3415* (2013.01); *G01R 33/34007* (2013.01); *G01R 33/3607* (2013.01); *G01R 33/3614* (2013.01); *G01R 33/3685* (2013.01); *G01R 33/3657* (2013.01)

(58) Field of Classification Search
CPC .............. G01R 33/543; G01R 33/5659; G01R 33/3415; G01R 33/36; A61B 5/055

USPC ......................................................... 324/309
See application file for complete search history.

(56) References Cited

U.S. PATENT DOCUMENTS

| | | |
|---|---|---|
| 3,181,131 A | 4/1965 | Pryor et al. |
| 3,236,206 A | 2/1966 | Willinger |
| 3,495,069 A | 2/1970 | Cavanagh et al. |
| 3,534,983 A | 10/1970 | Alvey |

(Continued)

FOREIGN PATENT DOCUMENTS

WO  WO_2000037918   6/2000

OTHER PUBLICATIONS

Augustine, George J., "Combining patch-clamp and optical methods in brain slices", "Journal of Neuroscience Methods", 1994, pp. 163-169, vol. 54, Publisher: Elsevier.

(Continued)

*Primary Examiner* — Walter L Lindsay, Jr.
*Assistant Examiner* — Frederick Wenderoth
(74) *Attorney, Agent, or Firm* — Charles A. Lemaire; Jonathan M. Rixen; Lemaire Patent Law Firm, P.L.L.C.

(57) ABSTRACT

A method and apparatus for receiving (RX) radio-frequency (RF) signals suitable for MRI and/or MRS from MRI "coil loops" (antennae) that are overlapped and/or concentric, and each of which has a preamplifier and frequency-tuning circuitry and an impedance-matching circuitry, but wherein the loops optionally sized differently and/or located at different elevations (distances from the patient's tissue) in order to extract signal from otherwise cross-coupled coil loops and to improve signal-to-noise ratio (SNR) in images made from the received signal.

21 Claims, 16 Drawing Sheets

(56) References Cited

U.S. PATENT DOCUMENTS

| | | | |
|---|---|---|---|
| 3,633,161 A | 1/1972 | Price | |
| 3,636,037 A | 1/1972 | Donninger et al. | |
| 3,636,414 A | 1/1972 | McIntosh et al. | |
| 3,650,116 A | 3/1972 | Cunningham | |
| 3,788,056 A | 1/1974 | Burri | |
| 3,788,057 A | 1/1974 | Batsch | |
| 3,788,058 A | 1/1974 | Idei et al. | |
| 3,888,348 A | 6/1975 | Frey | |
| 3,930,480 A | 1/1976 | Yamada et al. | |
| 3,946,840 A | 3/1976 | Sommer | |
| 4,391,146 A | 7/1983 | Grindheim | |
| 4,682,125 A | 7/1987 | Harrison et al. | |
| 4,763,076 A | 8/1988 | Arakawa et al. | |
| 4,801,553 A | 1/1989 | Owen et al. | |
| 4,881,034 A | 11/1989 | Kaufman et al. | |
| 4,885,539 A | 12/1989 | Roemer et al. | |
| 4,894,589 A | 1/1990 | Borowiec | |
| 4,947,119 A | 8/1990 | Ugurbil et al. | |
| 5,075,600 A | 12/1991 | El-Hamasy et al. | |
| 5,248,943 A * | 9/1993 | Fox | G01R 33/3415 324/312 |
| 5,304,930 A | 4/1994 | Crowley et al. | |
| 5,449,206 A | 9/1995 | Lockwood | |
| 5,480,482 A | 1/1996 | Novinson | |
| 5,557,247 A | 9/1996 | Vaughan, Jr. | |
| 5,564,096 A * | 10/1996 | Hama | G04G 21/04 361/818 |
| 5,612,706 A * | 3/1997 | Podell | H01Q 19/30 343/817 |
| 5,665,398 A | 9/1997 | McCormick | |
| 5,670,881 A | 9/1997 | Arakawa et al. | |
| 5,714,831 A | 2/1998 | Walker et al. | |
| 5,744,957 A | 4/1998 | Vaughan, Jr. | |
| 5,777,475 A | 7/1998 | Vester | |
| 5,836,877 A | 11/1998 | Zavislan | |
| 5,886,596 A | 3/1999 | Vaughan, Jr. | |
| 5,908,386 A | 6/1999 | Ugurbil et al. | |
| 5,958,607 A | 9/1999 | Kim et al. | |
| 5,969,992 A | 10/1999 | Mehta et al. | |
| 5,975,115 A | 11/1999 | Schwegler et al. | |
| 5,977,502 A | 11/1999 | Mizoguchi et al. | |
| 5,980,002 A | 11/1999 | Crowe | |
| 5,990,681 A | 11/1999 | Richard et al. | |
| 3,002,251 A | 12/1999 | Sun | |
| 6,002,251 A | 12/1999 | Sun | |
| 6,100,694 A | 8/2000 | Wong | |
| 6,150,816 A | 11/2000 | Srinivasan | |
| 6,300,761 B1 | 10/2001 | Hagen et al. | |
| 6,396,271 B1 | 5/2002 | Burl et al. | |
| 6,495,069 B1 | 12/2002 | Lussey et al. | |
| 6,534,983 B1 | 3/2003 | Boskamp et al. | |
| 6,538,441 B1 | 3/2003 | Watkins et al. | |
| 6,593,744 B2 | 7/2003 | Burl et al. | |
| 6,605,775 B1 | 8/2003 | Seeber et al. | |
| 6,633,161 B1 | 10/2003 | Vaughan, Jr. | |
| 6,636,037 B1 | 10/2003 | Ou-Yang | |
| 6,636,414 B2 | 10/2003 | Obert et al. | |
| 6,650,116 B2 | 11/2003 | Garwood et al. | |
| 6,664,465 B2 | 12/2003 | Seeber et al. | |
| 6,788,056 B2 | 9/2004 | Vaughan, Jr. et al. | |
| 6,788,057 B1 | 9/2004 | Petropoulos et al. | |
| 6,788,058 B1 | 9/2004 | Petropoulos et al. | |
| 6,822,448 B2 | 11/2004 | Watkins et al. | |
| 6,822,450 B2 | 11/2004 | Klinge et al. | |
| 6,834,238 B1 | 12/2004 | Hochman | |
| 6,888,348 B2 | 5/2005 | Kupce | |
| 6,930,480 B1 | 8/2005 | Fijita et al. | |
| 6,946,840 B1 | 9/2005 | Zou et al. | |
| 6,958,607 B2 | 10/2005 | Vaughan, Jr. et al. | |
| 6,969,992 B2 | 11/2005 | Vaughan, Jr. et al. | |
| 6,975,115 B1 | 12/2005 | Fujita et al. | |
| 6,977,502 B1 | 12/2005 | Hertz | |
| 6,980,002 B1 | 12/2005 | Petropoulos et al. | |
| 7,023,209 B2 | 4/2006 | Zhang et al. | |
| 7,042,222 B2 | 5/2006 | Zheng et al. | |
| 7,071,693 B2 | 7/2006 | Yasuhara | |
| 7,084,631 B2 | 8/2006 | Qu et al. | |
| 7,088,104 B2 | 8/2006 | Bottomley | |
| 7,119,541 B2 | 10/2006 | Barberi | |
| 7,123,012 B2 | 10/2006 | Srinivasan | |
| 7,132,829 B2 | 11/2006 | Hudson et al. | |
| 7,268,554 B2 | 9/2007 | Vaughan, Jr. | |
| 7,279,899 B2 | 10/2007 | Michaeli et al. | |
| 7,292,038 B2 | 11/2007 | Doty | |
| 7,295,870 B2 | 11/2007 | Allain et al. | |
| 7,352,185 B1 | 4/2008 | Zens et al. | |
| 7,403,006 B2 | 7/2008 | Garwood et al. | |
| 7,436,103 B2 | 10/2008 | Kawakubo et al. | |
| 7,439,736 B2 | 10/2008 | Meaney et al. | |
| 7,474,098 B2 | 1/2009 | King | |
| 7,514,926 B2 | 4/2009 | Adriany et al. | |
| 7,526,330 B1 | 4/2009 | Randell et al. | |
| 7,598,739 B2 | 10/2009 | Vaughan, Jr. et al. | |
| 7,633,293 B2 | 12/2009 | Olson et al. | |
| 7,672,650 B2 | 3/2010 | Sorrells et al. | |
| 7,701,209 B1 | 4/2010 | Green | |
| 7,710,117 B2 | 5/2010 | Vaughan et al. | |
| 7,777,484 B2 | 8/2010 | Garwood et al. | |
| 7,800,368 B2 | 9/2010 | Vaughan et al. | |
| 7,906,966 B1 | 3/2011 | Votruba | |
| 8,035,384 B2 | 10/2011 | Saha | |
| 8,055,326 B1 | 11/2011 | Dworkin et al. | |
| 8,093,900 B2 | 1/2012 | Bennett | |
| 8,093,978 B2 | 1/2012 | Kawarai et al. | |
| 8,190,237 B2 | 5/2012 | Driemel | |
| 8,193,809 B2 | 6/2012 | Akgun et al. | |
| 8,198,895 B2 | 6/2012 | Iannotti et al. | |
| 8,217,653 B2 | 7/2012 | Vaughan et al. | |
| 8,222,796 B2 | 7/2012 | Bhaskaran et al. | |
| 8,299,681 B2 | 10/2012 | Snyder et al. | |
| 8,334,697 B2 | 12/2012 | Overweg et al. | |
| 8,380,266 B2 | 2/2013 | Vaughan, Jr. et al. | |
| 8,525,116 B2 | 9/2013 | Schulz et al. | |
| 8,604,791 B2 | 12/2013 | Vaughan et al. | |
| 8,674,695 B2 | 3/2014 | Wiggins | |
| 8,788,044 B2 | 7/2014 | John | |
| 8,816,566 B2 | 8/2014 | Snyder, Jr. et al. | |
| 8,981,774 B2 | 3/2015 | Leussler | |
| 9,024,636 B2 | 5/2015 | Kozlov et al. | |
| 9,500,727 B2 | 11/2016 | Sohn et al. | |
| 2003/0091980 A1 | 5/2003 | Lynch et al. | |
| 2003/0119677 A1 | 6/2003 | Qiyan et al. | |
| 2003/0206019 A1 | 11/2003 | Boskamp | |
| 2005/0264291 A1 | 12/2005 | Vaughan et al. | |
| 2006/0001426 A1 | 1/2006 | Vaughan et al. | |
| 2006/0279284 A1 | 12/2006 | Vaughan, Jr. | |
| 2007/0236490 A1 | 10/2007 | Casteele et al. | |
| 2008/0180101 A1 | 7/2008 | Bradshaw et al. | |
| 2008/0262339 A1 | 10/2008 | Garwood et al. | |
| 2009/0134965 A1 | 5/2009 | Lemdiasov et al. | |
| 2009/0264733 A1 | 10/2009 | Corum et al. | |
| 2010/0123551 A1 * | 5/2010 | Fritchie | G01N 35/00732 340/10.1 |
| 2010/0147801 A1 | 6/2010 | Sago et al. | |
| 2012/0242550 A1 * | 9/2012 | Snyder | H02N 2/046 343/745 |
| 2012/0286921 A1 * | 11/2012 | Wang | G01R 33/3635 336/84 R |
| 2013/0009644 A1 * | 1/2013 | Kawai | G01R 33/365 324/322 |
| 2013/0021203 A1 * | 1/2013 | Gritz | H01Q 19/062 342/368 |
| 2013/0066399 A1 * | 3/2013 | Min | H01Q 1/2225 607/59 |
| 2013/0093425 A1 * | 4/2013 | Chu | G01R 33/34084 324/318 |
| 2013/0106416 A1 | 5/2013 | Morich et al. | |
| 2013/0131498 A1 * | 5/2013 | Taracila | G01R 33/34084 600/422 |
| 2013/0200982 A1 * | 8/2013 | Adachi | H01F 27/365 336/84 R |

(56) References Cited

U.S. PATENT DOCUMENTS

2015/0077117 A1 3/2015 Snyder et al.
2015/0123660 A1 5/2015 Vaughan, Jr. et al.

OTHER PUBLICATIONS

Cho, Y.K., et al., "Noninvasive measurements of transmural myocardial metabolites using 3-D (31)P NMR spectroscopy.", "Am J Physiology", 2001, pp. H489-H497, vol. 280, No. 1.

Nelder, J.A., et al., "A simplex method for function minimization", "Comput J. ", 1965, pp. 308-313, vol. 7, No. 4.

Roemer, et al., "The NMR Phased Array", "Magnetic Resonance in Medicine", 1990, pp. 192-225, vol. 16.

Sung K., et al., "B1+ Compensation in 3T Cardiac Imaging Using Short 2DRF Pulses", "Magnetic Resonance in Medicine", 2008, pp. 441-446, vol. 59, No. 3.

Vaughan, J.T., et al., "Clinical Imaging at 7T with a 16 Channel Whole Body Coil and 32 Receive Channels.", "Proceedings 17th Scientific Meeting, International Society for Magnetic Resonance in Medicine", Apr. 2009, p. 392.

Wiggins, et al., "96-Channel Receive-Only Head Coil for 3 Tesla: Design Optimization and Evaluation", "Magn. Reson. Med.", Sep. 2009, pp. 754-762, vol. 62, No. 3.

\* cited by examiner

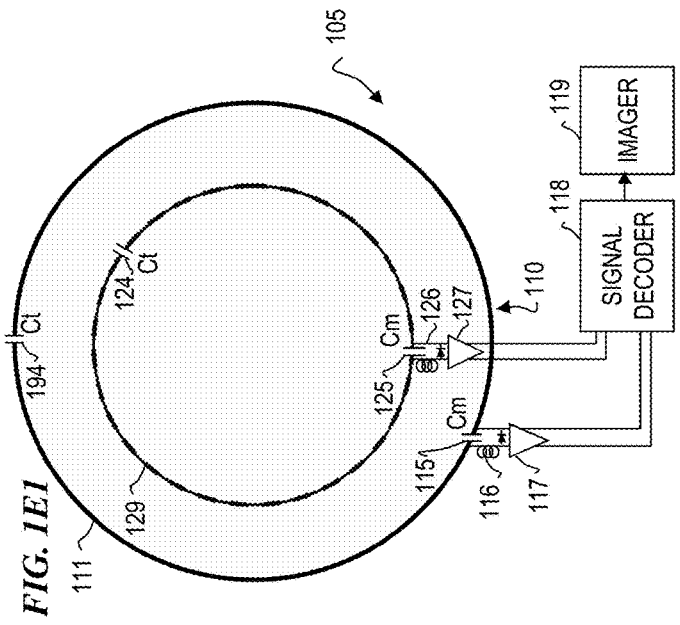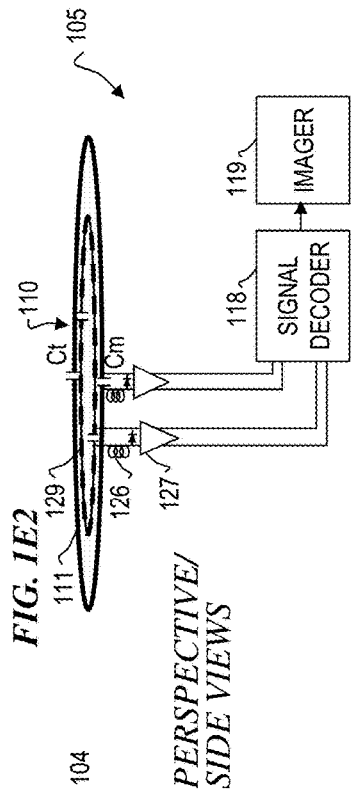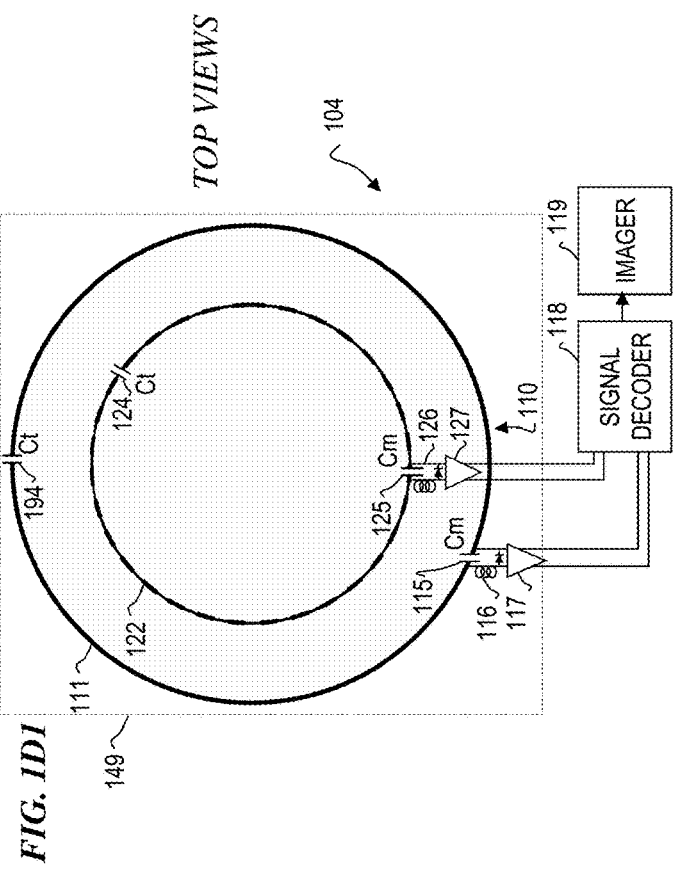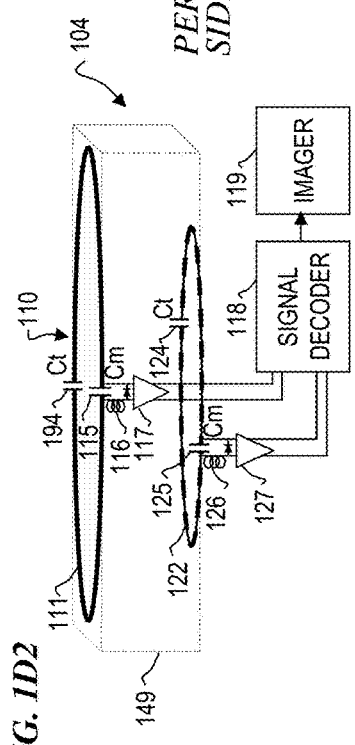
FIG. 1D1 FIG. 1E1
TOP VIEWS
FIG. 1D2 FIG. 1E2
PERSPECTIVE/SIDE VIEWS

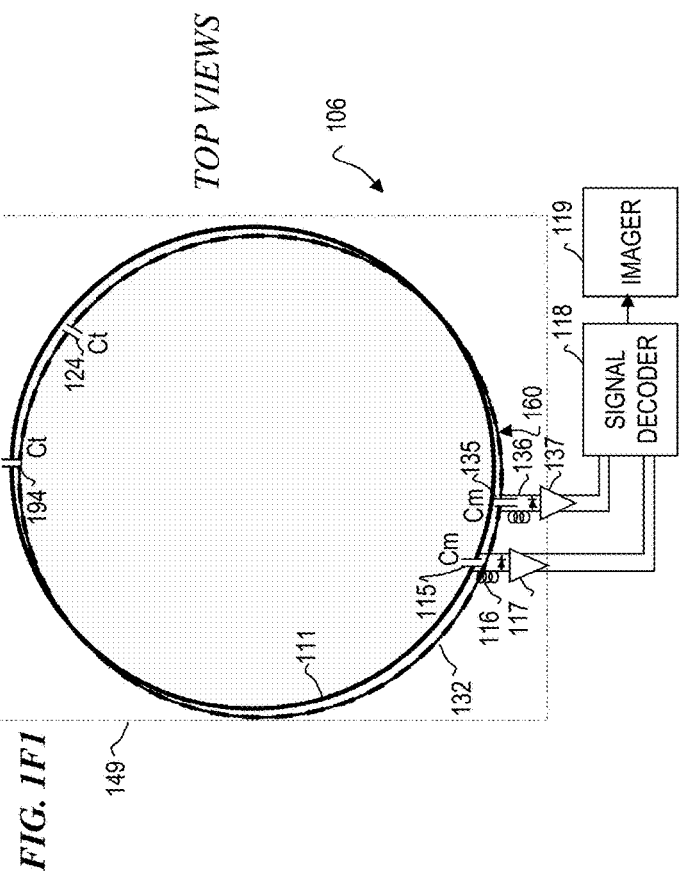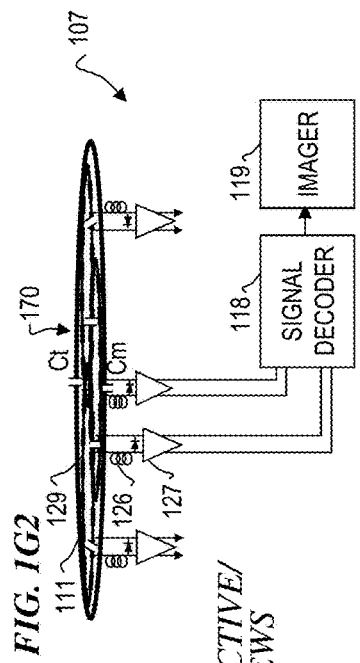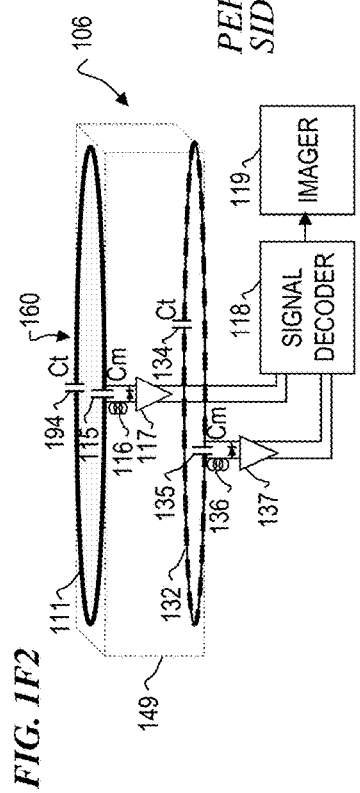

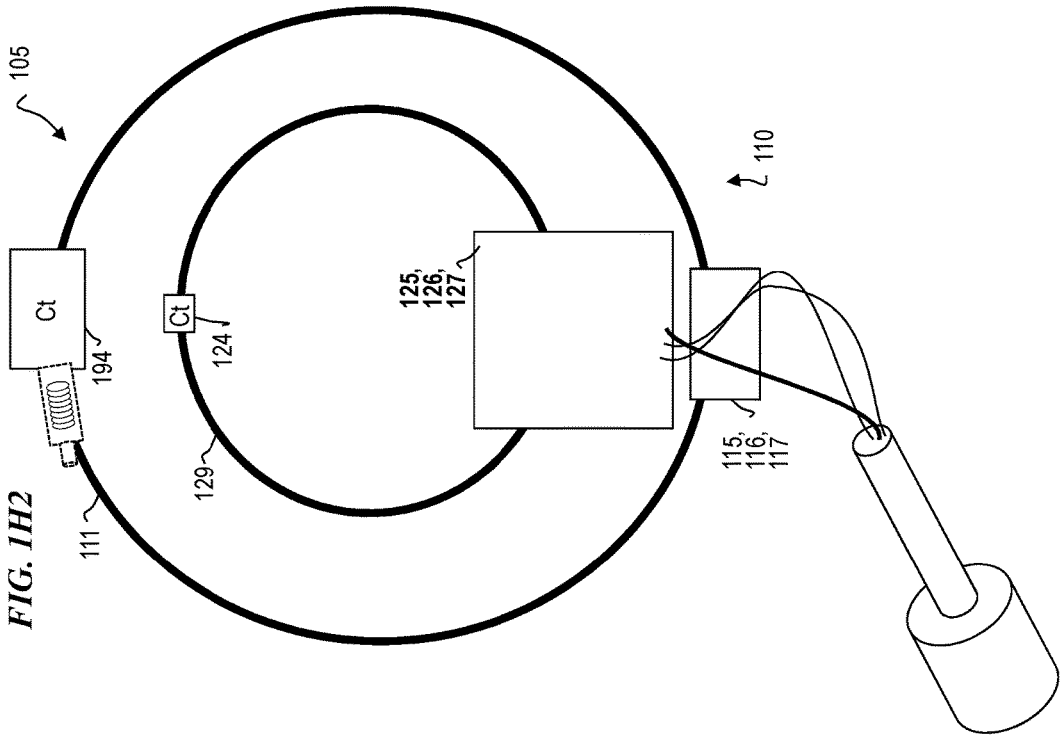
FIG. 1H1
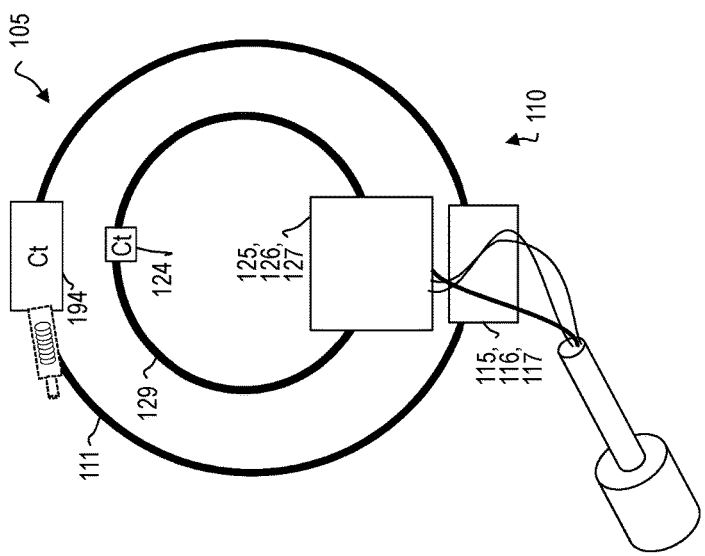
FIG. 1H2

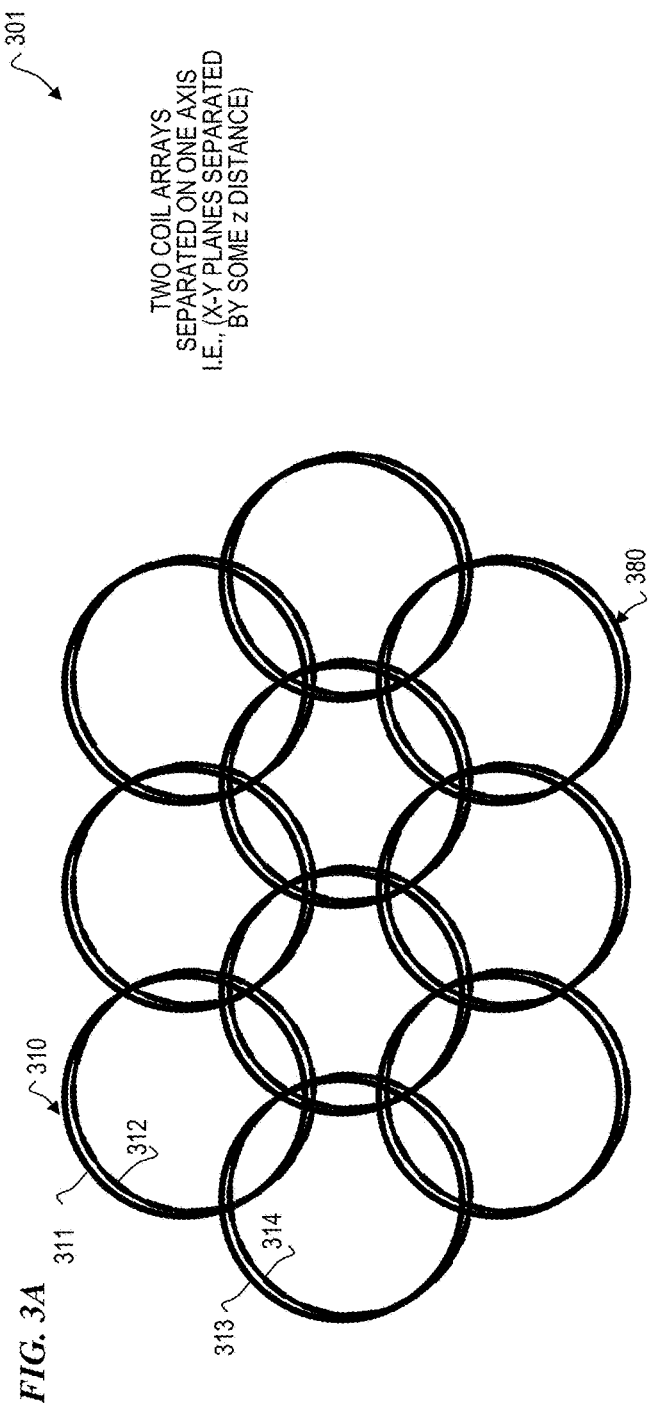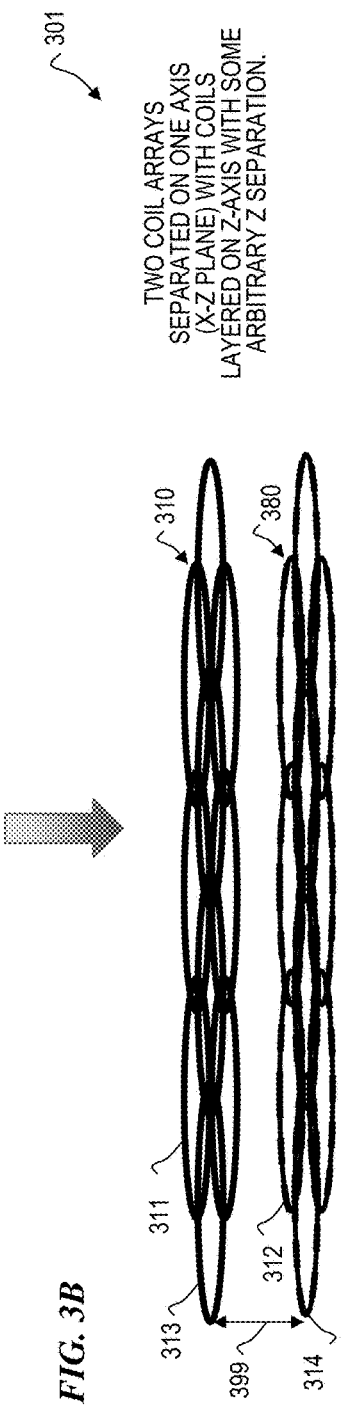
FIG. 3A
FIG. 3B

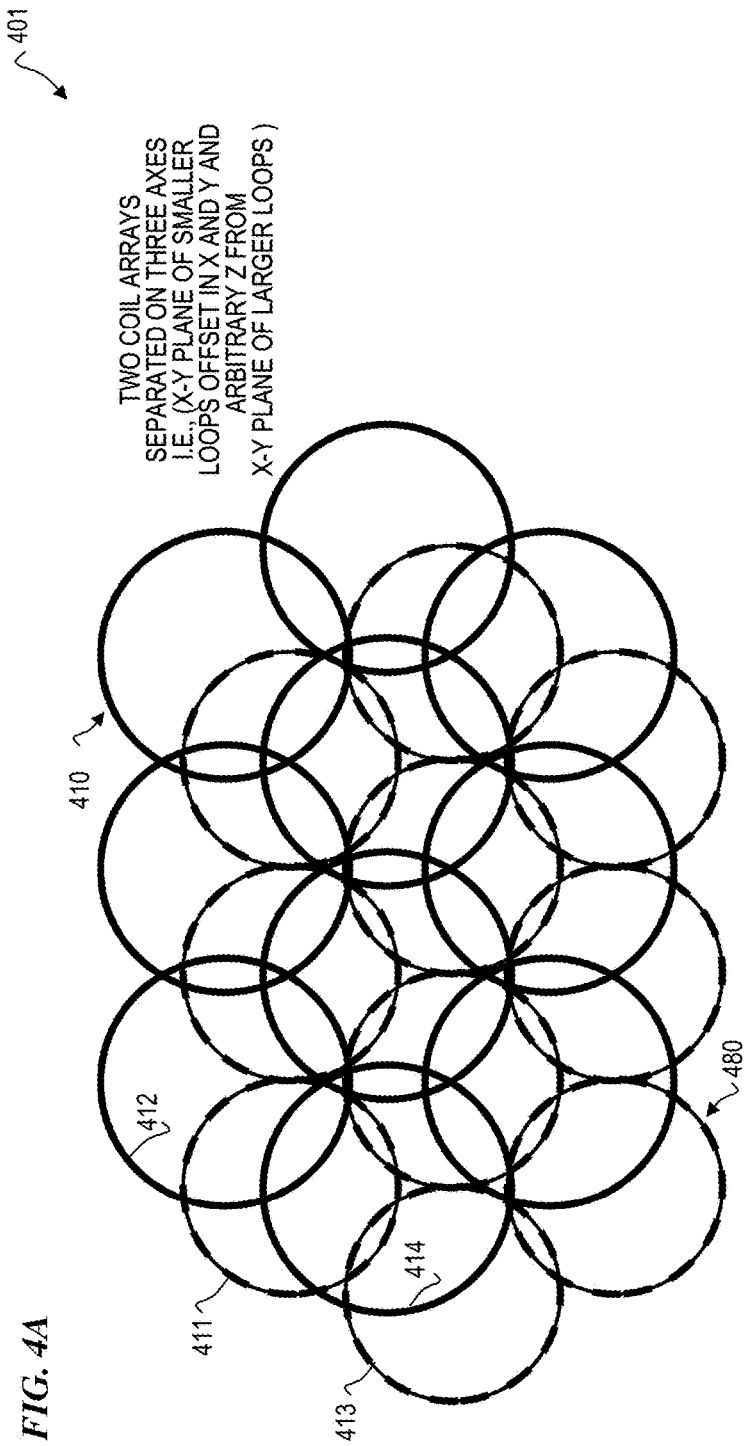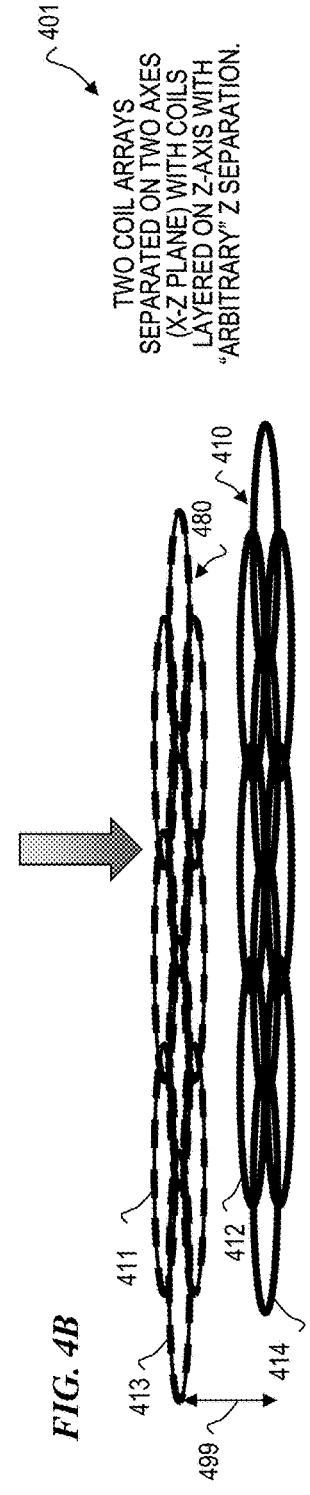
FIG. 4A
FIG. 4B

DEVICE AND METHOD FOR LOOPS-OVER-LOOPS MRI COILS

CROSS-REFERENCE TO RELATED APPLICATIONS

This invention claims benefit of U.S. Provisional Patent Application 61/939,255 filed Feb. 12, 2014, titled "DEVICE AND METHOD FOR LOOPS-OVER-LOOPS MRI COILS," which is incorporated herein by reference in its entirety.

FIELD OF THE INVENTION

This invention relates to the field of magnetic-resonance imaging (MRI) and magnetic-resonance spectroscopy (MRS), and more specifically to a method and apparatus for transmitting (TX) and receiving (RX) radio-frequency (RF) signals suitable for MRI and/or MRS from MRI "coils" (antennae) that are overlapped and/or concentric, but optionally sized differently and/or located at different elevations (distances from the patient's tissue) in order to extract signal from otherwise cross-coupled coil loops and to improve signal-to-noise ratio (SNR) of the received signal.

BACKGROUND OF THE INVENTION

U.S. Pat. No. 6,605,775 to Seeber et al. issued Aug. 12, 2003 with the title "Floating radio frequency trap for shield currents" and is incorporated herein by reference. In U.S. Pat. No. 6,605,775, Seeber et al. describe a floating shield current trap that provides first and second concentric tubular conductors electrically connected to provide a resonance-induced high impedance of current flow in a path consisting of the inner and outer conductors and their junctions thereby suppressing coupled current flow on a shield of a conductor contained within the first inner tubular conductor.

U.S. Pat. No. 6,664,465 to Seeber issued Dec. 16, 2003 with the title "Tuning system for floating radio frequency trap" and is incorporated herein by reference. In U.S. Pat. No. 6,664,465, Seeber describes a floating shield current trap provides two resonance loops formed of split concentric tubular conductors joined radially at their axial ends. Adjustment of the separation of these loops provides a change in coupling between the loops effecting a simplified tuning of the resonance of the trap for different expected frequencies of interfering shield current.

U.S. Pat. No. 6,593,744 to Burl et al. issued Jul. 15, 2003 with the title "Multi-channel RF cable trap for magnetic resonance apparatus" and is incorporated herein by reference. In U.S. Pat. No. 6,593,744, Burl et al. describe a multi-channel RF cable trap that blocks stray RF current from flowing on shield conductors of coaxial RF cables of a magnetic resonance apparatus. An inductor is formed by a curved semi-rigid trough constructed of an insulating material coated with an electrically conducting layer. Preferably, the inductor and the cable follow an "S"-shaped path to facilitate good electromagnetic coupling. The RF cables are laid in the trough and the shield conductors inductively couple with the inductor. A capacitor and optional trim capacitor are connected across the trough of the inductor to form a resonant LC circuit tuned to the resonance frequency. The LC circuit inductively couples with the shield conductors to present a signal-attenuating high impedance at the resonance frequency. The resonant circuit is preferably contained in an RF-shielding box with removable lid.

Low-power circuits can use varactors (electrically variable capacitors), field-effect transistors (used as variable gain elements or variable resistors) and like components that are directly electrically-adjustable, for use in adjusting frequency, impedance or other circuit characteristics and parameters, however such components are often unsuitable or inoperative in high fields.

U.S. Pat. No. 6,495,069 issued Dec. 17, 2002 to Lussey et al. with the title "Polymer composition" and is incorporated herein by reference. In U.S. Pat. No. 6,495,069, Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 8,299,681 to Snyder, Vaughan and Lemaire issued Oct. 30, 2012 with the title "Remotely adjustable reactive and resistive electrical elements and method" and is incorporated herein by reference. In U.S. Pat. No. 8,299,681, Snyder, Vaughan and Lemaire describe an apparatus and method that includes providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

United States Patent Application Publication Number 20100253348 by Wiggins published Oct. 7, 2010 with the title "Radio Frequency Coil Arrangement for High Field Magnetic Resonance Imaging with Optimized Transmit and Receive Efficiency for a Specified Region of Interest, and Related System and Method," and is incorporated herein by reference. In the application, Wiggins describes exemplary embodiments of a coil arrangement that can include, e.g., a plurality of elements which can be provided at an angle from one another. The angle can be selected to effectuate an imaging of a target region of interest at least one of a predetermined depth or range of depths, for example. In certain exemplary embodiments according to the present disclosure, the angle can be selected to effectuate an exemplary predetermined transmit efficiency for at least one of the elements. Additionally, the exemplary angle can be selected to effectuate a predetermined receive sensitivity for at least one of the elements. Further, according to certain exemplary embodiments of a coil arrangement in according to the present disclosure, the angle can be adjusted manually and/or automatically.

A journal article, "96-Channel Receive-Only Head Coil for 3 Tesla: Design Optimization and Evaluation" by Graham C. Wiggins et al., Magn. Reson. Med. 2009 September; 62(3): 754-762. doi:10.1002/mrm.22028, describes a receive coil, and is incorporated herein by reference.

U.S. Pat. No. 4,885,539 to Roemer et al. issued Dec. 5, 1989 with the title "Volume NMR coil for optimum signal-to-noise ratio" and is incorporated herein by reference. In U.S. Pat. No. 4,885,539, Roemer et al. describe an RF volume coil with optimized signal-to-noise ratio, for NMR use, has a reduced length which is between about 0.3 $r_s$ and about 1.5 $r_s$, where $r_s$ is the radius of a sample-to-be-investigated, contained within the cylindrical volume coil, with the volume coil radius $r_c$ being between about 1.0 $r_s$ and about 1.6 $r_s$ the "short" volume coil has an improved SNR for a voxel located substantially on the central plane of the coil, relative to the SNR of a "normal"-length volume coil with $L_c$ greater or equal to 4 $r_s$.

A journal article, "The NMR Phased Array" by P. B. Roemer et al., Magn Reson Med. 1990 November; Vol. 16 Issue 262 pages 192-225; describes a phased array receive coil, and is incorporated herein by reference. Roemer et al. describe ways to overlap coil loops (circular loops overlapped by spacing the centers of the circular loops at 0.75 diameter, and square loops by about 0.9 diameter; and the loops are all the same size) to reduce mutual-induction interference.

U.S. Pat. No. 6,534,983 to Boskamp et al. issued Mar. 18, 2003 with the title "Multi-channel phased array coils having minimum mutual inductance for magnetic resonance systems" and is incorporated herein by reference. In U.S. Pat. No. 6,534,983, Boskamp et al. describe a multi-channel phased array coil for use in a magnetic resonance (MR) system is disclosed herein. The phased array coil includes N coils configured in an array, each of the N coils having a geometric shape and overlapping with (N−1) coils to form an overlap area within the array. The geometric shape of each of the coils and the overlap area are configured to cause a mutual inductance between every pair of the coils to be less than 10 percent of the self-inductance of each of the N coils. At least four coils are provided in the phased array coil.

U.S. Pat. No. 6,538,441 issued to Watkins et al. on Mar. 25, 2003 with the title "RF coil for reduced electric field exposure for use in very high field magnetic resonance imaging" and is incorporated herein by reference. In U.S. Pat. No. 6,538,441, Watkins et al. describe an RF coil assembly for a very high field Magnetic Resonance Imaging (MRI) system is provided. The RF coil assembly comprises a plurality of conductors arranged cylindrically and disposed about a patient bore tube of the MRI system. Each of the conductors is configured for the RF coil assembly to resonate at substantially high frequencies. Further, the RF coil assembly comprises a plurality of capacitive elements disposed between and connecting respective ends of the conductors and further disposed in a spaced-apart relationship with the patient bore tube. The capacitive elements are for electrically interconnecting the plurality of conductors at the respective ends of the conductors.

U.S. Pat. No. 6,822,448 issued to Watkins et al. on Nov. 23, 2004 with the title "RF coil for very high field magnetic resonance" and is incorporated herein by reference. In U.S. Pat. No. 6,822,448, Watkins et al. describe an RF coil assembly for a very high field Magnetic Resonance Imaging (MRI) system is provided comprising a plurality of conductors arranged cylindrically and disposed about a cylindrical patient bore tube of the MRI system and a plurality of capacitive elements for electrically interconnecting the plurality of conductors at respective ends of the conductors. The conductors have a width selected for the RF coil assembly to resonate at substantially high frequencies. A very high field Magnetic Resonance Imaging (MRI) system is provided that comprises a RF coil assembly adapted to resonate at substantially high frequencies, a RF coil shield assembly and a plurality of RF drive power cables.

There is a long-felt need for improved SNR from received signals in an MRI system.

SUMMARY OF THE INVENTION

The present invention provides overlapped and/or concentric radio-frequency (RF) MRI coils that are optionally located at different elevations (distances from the patient's tissue) in order to extract signal from cross-coupled coil loops and to improve signal-to-noise ratio (SNR) of the received signal. A large number of independent receive pre-amplifiers (preamps) are used to collect the received signal and the MR image reconstructed from the received signal. In some embodiments, a plurality of preamps is connected to each of a plurality of coil loops. In some embodiments, the received signals are decoded (e.g., using differential analog amplifiers on the analog signals, or are digitally processed to remove common mode signal, and to improve SNR.

In contrast to U.S. Pat. No. 6,534,983 to Boskamp et al., (where the geometric shape of each of the coil loops and the overlap area are configured to cause a mutual inductance between every pair of the coil loops to be less than 10 percent of the self-inductance of each of the N coils) the present invention uses concentric and/or overlapped coil loops, each coil loop having one or more individual preamplifiers. In some embodiments, the plurality of loops of the present invention will be arranged to reduce mutual inductance, but the greater number of coil loops is used to advantage in order to achieve greater signal-to-noise ratio (SNR) in spite of the greater mutual inductance due to overlapping and/or concentric coil loops. The outputs of the plurality of preamplifiers are analyzed and decoded relative to one another to electronically and/or computationally remove signal due to the mutual inductance between various pairs of the coil loops.

In some embodiments, a set of coil loops have each of their outputs phase shifted by possibly different amounts, and have their respective amplitudes varied by possibly different amounts, and their signals added or subtracted from one another by decoder circuitry to improve the SNR.

BRIEF DESCRIPTION OF THE DRAWINGS

FIG. 1D1 is a plan-view block diagram of a coil-loops system 104 having a plurality of different-size-circumference concentric coil loops 111 and loop 122 each connected to one of a plurality of RF receiver-electronics systems (e.g., capacitor 115, RF trap 116, preamplifier 117), according to some embodiments of the present invention.

FIG. 1D2 is a slightly-tilted elevational-view block diagram of coil-loops system 104, showing different-size-circumference loop 111 and loop 122 separated from one another by a vertical distance from the patient being imaged, according to some embodiments of the present invention.

FIG. 1E1 is a plan-view block diagram of a coil-loops system 105 having a plurality of different-size-circumference concentric coil loops 111, 122 each connected to one of a plurality of RF receiver-electronics systems (e.g., capacitor 115, RF trap 116, preamplifier 117), according to some embodiments of the present invention.

FIG. 1E2 is a slightly-tilted elevational-view block diagram of coil-loops system 105, showing different-size-circumference loop 111 and loop 129 that are coplanar (not separated from one another by a vertical distance from the patient being imaged), according to some embodiments of the present invention.

FIG. 1F1 is a plan-view block diagram of a coil-loops system 106 having a plurality of equal-size-circumference concentric coil loops 111 and loop 132 each connected to one of a plurality of RF receiver-electronics systems (e.g., capacitor 115, RF trap 116, preamplifier 117), according to some embodiments of the present invention.

FIG. 1F2 is a slightly-tilted elevational-view block diagram of coil-loops system 106, showing equal-size-circumference loop 111 and loop 132 separated from one another by a vertical distance from the patient being imaged, according to some embodiments of the present invention.

FIG. 1G1 is a plan-view block diagram of a coil-loops system 107 having a plurality of different-size-circumference concentric coil loop 111, and a plurality of smaller loops 129 each connected to one of a plurality of receiver-electronics systems (e.g., capacitor 115, RF trap 116, preamplifier 117), according to some embodiments of the present invention.

FIG. 1G2 is a slightly-tilted elevational-view block diagram of coil-loops system 107, showing different-size-circumference loop 111 and the plurality of smaller loops 129 that are coplanar (not separated from one another by a vertical distance from the patient being imaged), according to some embodiments of the present invention.

FIG. 1H1 is a plan-view diagram of a photograph of coil-loops system 105 (see FIG. 1E1 described above) having a plurality of different-size-circumference concentric coil loops 110: coil loop 111 and coil loop 129, each connected to one of a plurality of receiver-electronics systems (e.g., capacitor 115, RF trap 116, preamplifier 117 for loop 111, and capacitor 125, RF trap 126, preamplifier 127 for loop 129, as shown in FIG. 1E1), according to some embodiments of the present invention.

FIG. 1H2 is an enlarged plan-view diagram of a photograph of coil-loops system 105 having a plurality of different-size-circumference concentric coil loops: coil loop 111 and coil loop 129, each connected to one of a plurality of receiver-electronics systems (e.g., capacitor 115, RF trap 116, preamplifier 117 for loop 111, and capacitor 125, RF trap 126, preamplifier 127 for loop 129, as shown in FIG. 1E1), according to some embodiments of the present invention.

FIG. 2 is a plan-view block diagram of a coil-loops system 201 having a plurality of overlapping and/or concentric coil loops 211, 212, 213, 214 each connected to one or more of a plurality of RF receiver-electronics systems (not shown), according to some embodiments of the present invention.

FIG. 3A is a plan-view block diagram of a coil-loops system 301 having a plurality of sets of concentric equal-size-circumference coil loops (the set that includes loops 311 and 313, and the set that includes loop 312 and 314) each connected to one of a plurality of RF receiver-electronics systems (not shown), according to some embodiments of the present invention.

FIG. 3B is a slightly-tilted elevational-view block diagram of coil-loops system 301, showing sets of concentric equal-size-circumference, the set that includes loops 311 and 313, and the set that includes loop 312 and 314, separated from one another by a vertical distance difference 399 measured from the patient being imaged, according to some embodiments of the present invention.

FIG. 4A is a plan-view block diagram of a coil-loops system 401 having a plurality of sets of non-concentric equal-size-circumference coil loops (the set that includes loops 411 and 413, and the set that includes loop 412 and 414) each connected to one of a plurality of RF receiver-electronics systems (not shown), according to some embodiments of the present invention.

FIG. 4B is a slightly-tilted elevational-view block diagram of coil-loops system 401, showing sets of non-concentric equal-size-circumference, the set that includes loops 411 and 413, and the set that includes loop 412 and 414, separated from one another by a vertical distance difference 499 measured from the patient being imaged, according to some embodiments of the present invention.

DESCRIPTION OF PREFERRED EMBODIMENTS

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

Figure 1A:
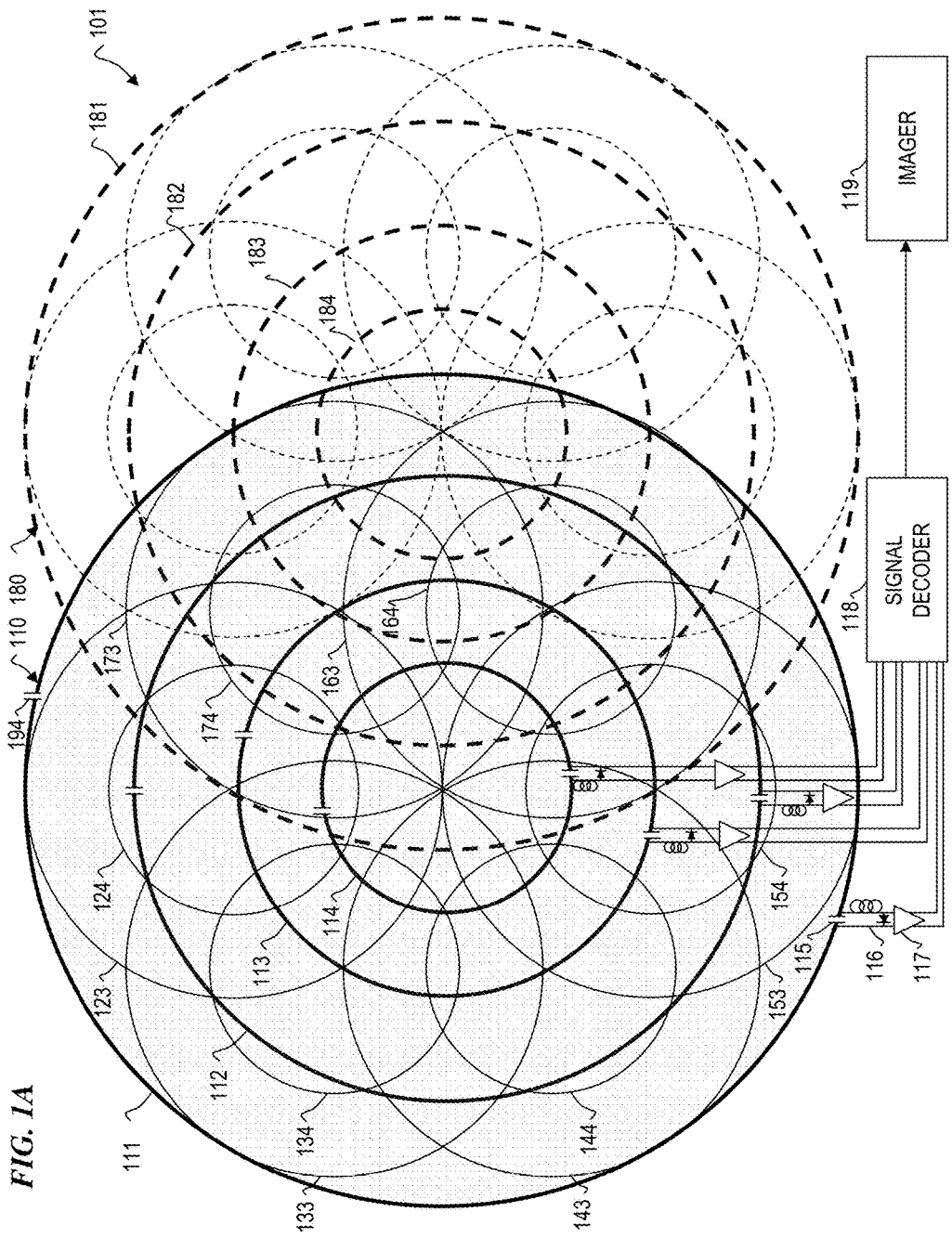
FIG. 1A is a plan-view block diagram of a coil-loops system 101 having a plurality of overlapping and/or concentric coil loops 111, 112, 113, 114 each connected to one of a plurality of RF receiver-electronics systems (e.g., capacitor 115, RF trap 116, preamplifier 117), according to some embodiments of the present invention.

FIG. 1A is a plan-view block diagram of a coil-loops system 101 having a first set 110 of coils loops that includes a plurality of concentric coil loops 111, 112, 113, 114 each connected to one of a plurality of RF receiver-electronics systems (e.g., capacitor 115, RF trap 116, preamplifier 117), according to some embodiments of the present invention. In some embodiments, each of the first set of concentric coil loops 111, 112, 113, 114 has its own set of receiver-electronics units, each including at least one frequency-tuning capacitor (e.g., 194 for loop 111, and corresponding frequency-tuning capacitors on coil loops 112, 113, 114), its own an impedance-matching capacitor (e.g., 115 for loop 111, and corresponding an impedance-matching capacitors on coil loops 112, 113, 114), its own RF trap (e.g., 116 for loop 111, and corresponding RF traps on coil loops 112, 113, 114), and its own pre-amp (e.g., 117 for loop 111, and corresponding pre-amps on coil loops 112, 113, 114). In some embodiments, each of the other overlapping and non-concentric loops has its own receiver-electronics unit (for clarity, those are not shown). In some embodiments, a second set 180 of concentric coil loops 181, 182, 183, 184 are located offset to the side of the first set 110 of concentric coil loops 111, 112, 113, 114, and each of those has its own set of receiver-electronics units (for clarity, those are not shown). In some embodiments, the plurality of receiver-electronics units each generates an output signal (in some embodiments, each output signal is a differential pair of signals), and these output signals are coupled to a signal decoder 118 that is configured to remove common-mode signals from the respective output signals based on others of the plurality of output signals, and the output of the signal decoder 118 is coupled to an imager 119 that, in some embodiments, uses conventional techniques to generate image slices of the patient being imaged, and stores the images for later analysis (e.g., usually this is done by a radiologist trained to interpret the images).

Figure 1B:
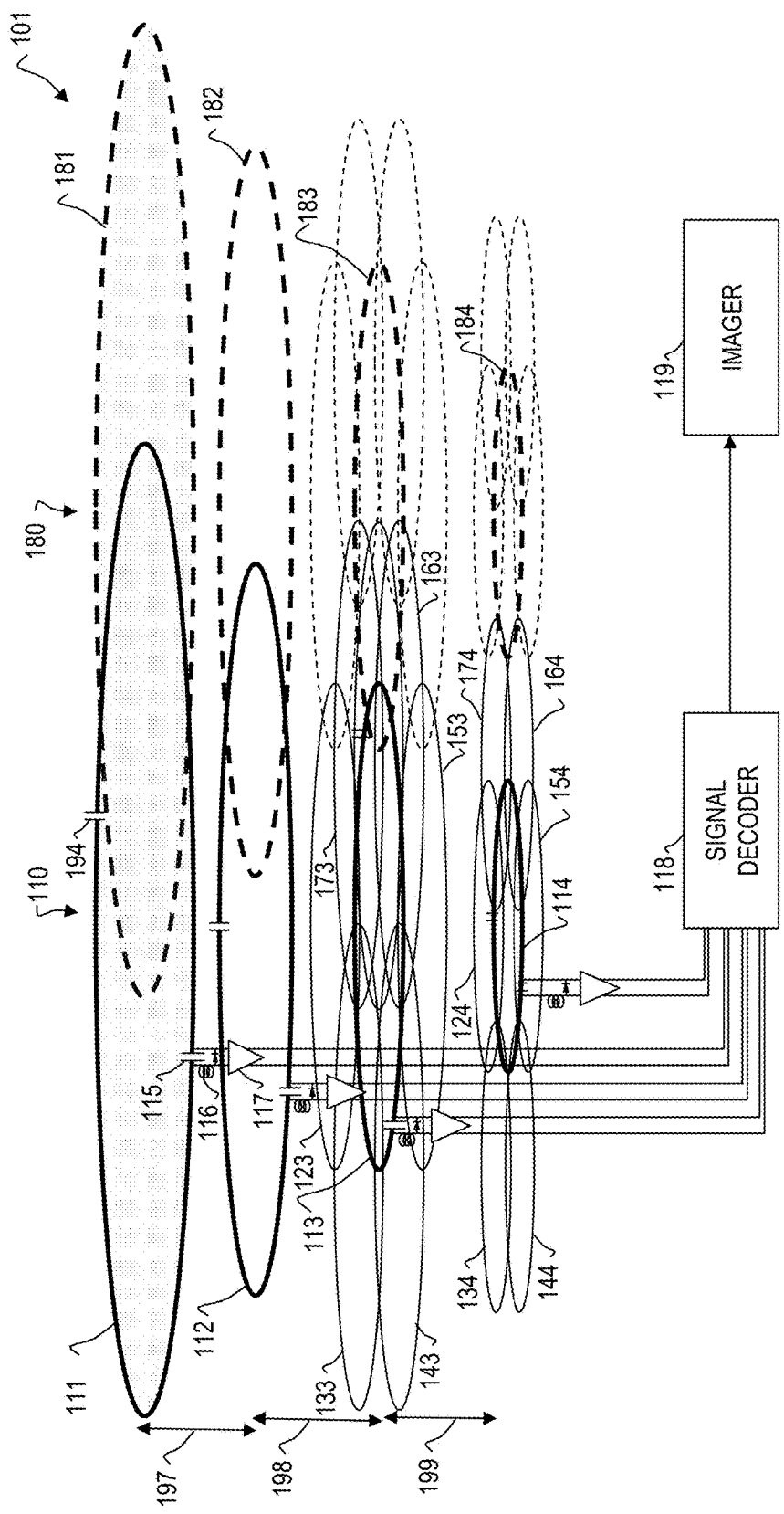
FIG. 1B is a slightly-tilted elevational-view block diagram of coil-loops system 101, according to some embodiments of the present invention.

FIG. 1B is a slightly-tilted elevational-view block diagram of coil-loops system 101, according to some embodiments of the present invention. In some embodiments, a first geometric plane contains loops 111 and 181, a second geometric plane contains loops 112 and 182, a third geometric plane contains loops 113 and 183, and a plurality of other overlapping loops including loops 123, 133, 143, 153, 163 and 173, and others that are not individually labeled with reference numbers, a fourth geometric plane contains loops 111 and 181, and a plurality of other overlapping loops including loops 124, 134, 144, 154, 164 and 174, and others that are not individually labeled with reference numbers. In some embodiments, the first geometric plane is separated from the second geometric plane by a distance 197, the second geometric plane is separated from the third geometric plane by a distance 198, and the third geometric plane is separated from the fourth geometric plane by a distance 199. Other aspects of the items in FIG. 1B are as set forth above for FIG. 1A. Note that FIG. 1B is a slightly-tilted elevational-view because the four geometric planes will show as single lines when viewed edge-on, which does not convey the idea shown here.

Figure 1C:
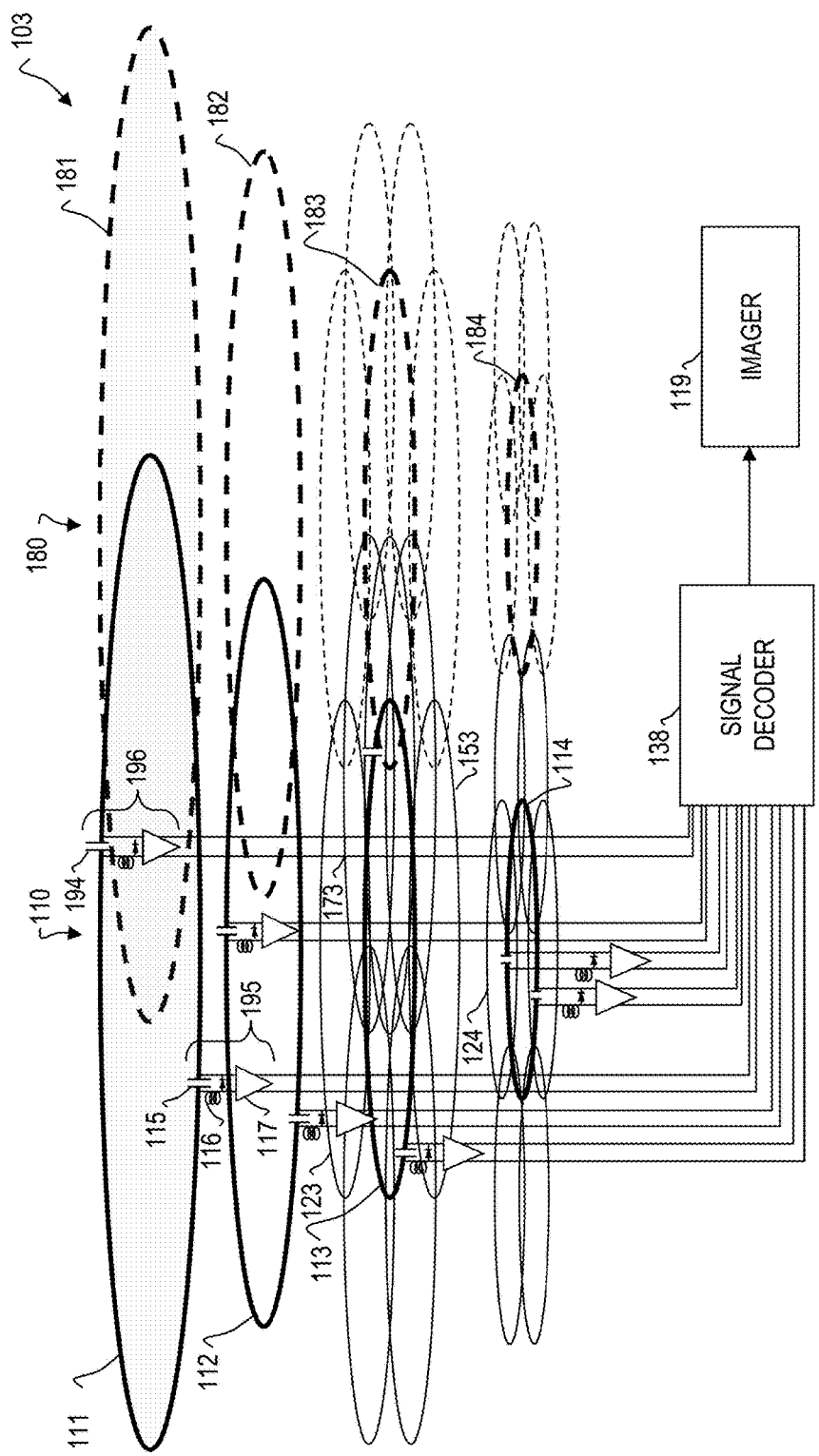
FIG. 1C is a slightly-tilted elevational-view block diagram of coil-loops system 103 having a plurality of overlapping and/or concentric coil loops 111, 112, 113, 114 each connected to two of a plurality of sets of RF receiver-electronics systems (e.g., capacitor 115, RF trap 116, preamplifier 117), according to some embodiments of the present invention.

FIG. 1C is a slightly-tilted elevational-view block diagram of coil-loops system 103 having a plurality of overlapping and/or concentric coil loops 111, 112, 113, 114 each connected to two of a plurality of sets of RF receiver-electronics systems (e.g., capacitor 115, RF trap 116, preamplifier 117) and 196, according to some embodiments of the present invention. The main difference between system 103 and system 101 described above is that each of a plurality of the antenna-receiver loops in system 103 has a plurality of receiver-electronics units, each with its own respective preamplifier receiving signals from spaced-apart locations on the respective loops. In the example shown here, two receiver-electronics units are connected to concentric coil loops 111, 112, 113, 114.

Figure 2:
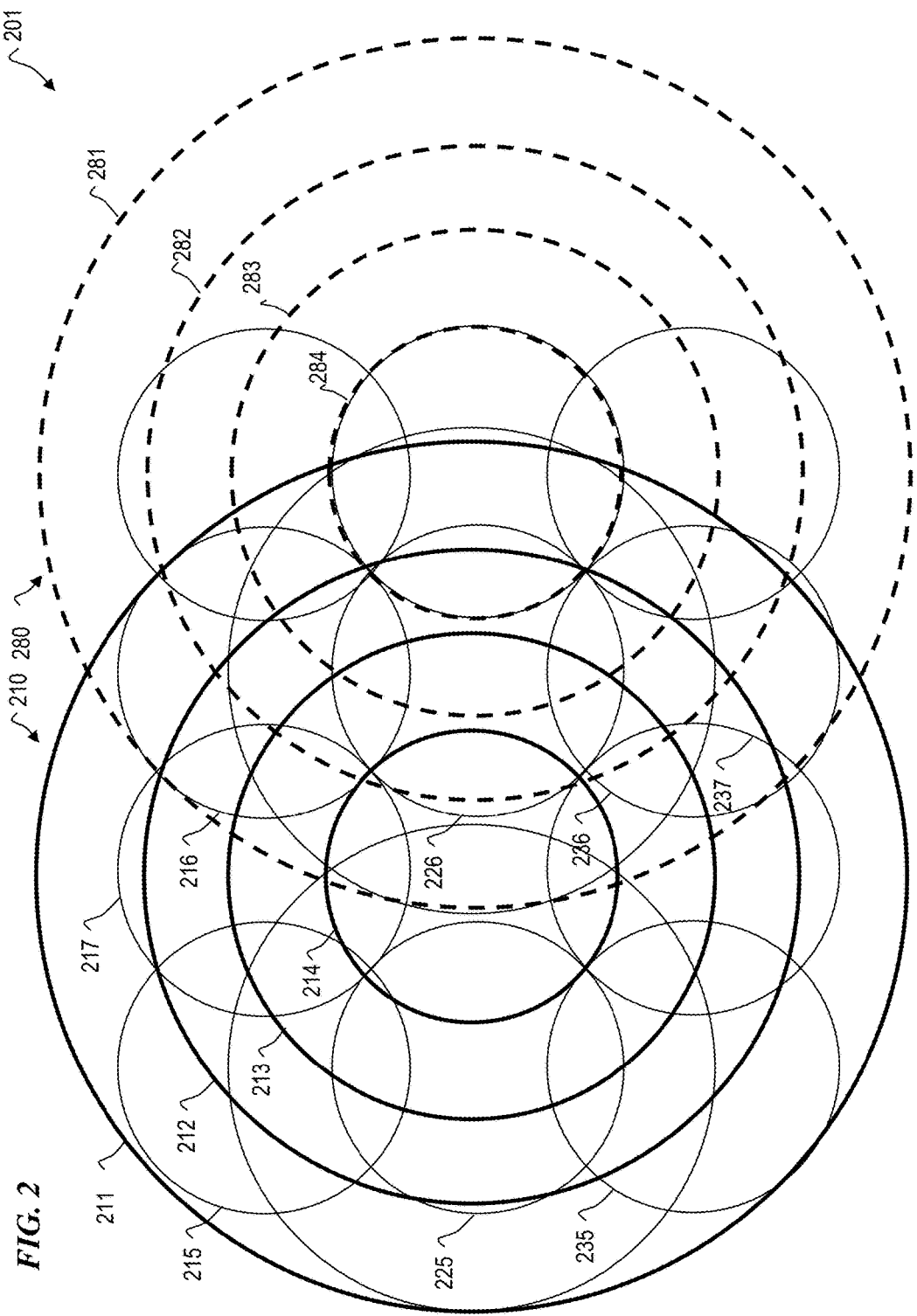

Note that as used herein, "concentric" loops are loops whose centers are on a single line perpendicular to the surface of the patient (e.g., a vertical line of the surface of the patient is in a horizontal plane). "Concentric" loops may be in planes that are spaced apart as shown in FIG. 1B and FIG. 1C, or in co-planar configurations such as shown in FIG. 1E2 described below. In the latter case (such as shown in FIG. 1E2), the loops are referred to as "concentric and co-planar." In the former case (such as shown in FIG. 1D2, FIG. 3A and FIG. 3B), the loops are referred to as "concentric and spaced apart." In the cases such as shown in FIG. 4A and FIG. 4B), the loops are referred to as "both laterally offset and spaced apart." In some embodiments, two loops are in planes that are both angled to one another (not parallel or co-planar) and having centers that are both on a line perpendicular to the surface of the tissue being imaged but wherein the centers of the two loops are spaced apart, termed "loops on planes angled to one another and having spaced-apart loop centers." In some embodiments, two loops are in planes that are both angled to one another (not parallel or co-planar) and having centers that are both on the same point (not spaced apart), termed "loops on planes angled to one another and having loop centers on a single point."

FIG. 1D1 is a plan-view block diagram of a concentric-and-spaced-apart coil-loops system 104 having a plurality of different-size-circumference concentric coil loops 111 and loop 122 each connected to one of a plurality of RF receiver-electronics systems (e.g., capacitor 115, RF trap 116, preamplifier 117), according to some embodiments of the present invention. In some embodiments, a dielectric substrate 149 is provided, with loop 111 affixed to the outer major face (the top surface in the drawing of FIG. 1D2) and loop 122 affixed to the inner (opposite-side) major face (the bottom surface in the drawing of FIG. 1D2). In some embodiments, the smaller loop 122 obtains image from a smaller-diameter shallower volume of tissue, while the larger loop 111 obtains image from a larger-diameter deeper volume of tissue. In other embodiments, the smaller loop 122 is mounted to the outer surface and the larger loop 111 is mounted to the surface of substrate 149 that is closer to the subject patient being imaged. In some embodiments, impedance-matching capacitor 125, RF trap 126, and preamplifier 127 are coupled to one side of loop 122, while frequency-tuning capacitor 124 is coupled to an opposite side (180 degrees away) of loop 122.

In some embodiments, (not shown), the plane of loop 111 and the plane of loop 122 are at an angle to one another, in order to reduce cross-coupling somewhat. In some embodiments, three or more loops are each in planes that are angled (not parallel) to each of the other loops.

FIG. 1D2 is a slightly-tilted elevational-view block diagram of concentric-and-spaced-apart coil-loops system 104, showing different-size-circumference loop 111 and loop 122 separated from one another by a vertical distance from the patient being imaged, according to some embodiments of the present invention. Note that FIG. 1D2 is a slightly-tilted elevational-view because the two geometric planes would show as two spaced apart but single lines when viewed edge-on, which does not as clearly convey the idea shown here.

FIG. 1E1 is a plan-view block diagram of a coil-loops system 105 having a plurality of different-size-circumference co-planar and concentric coil loops 111, 129 each connected to one of a plurality of RF receiver-electronics systems (e.g., capacitor 115, RF trap 116, preamplifier 117), according to some embodiments of the present invention. System 105 is substantially similar to system 104 described above, except that the plurality of different-size-circumference loops are co-planar or substantially co-planar (i.e., as used herein, planes that are within 2 mm of one another and/or within about five (5) degrees of tilt or less are termed to be "substantially co-planar"). In some embodiments, the coil loops have a common center point, or have center points that are separated by more than 2 mm, but the planes of the loops are tilted relative to one another by more than five degrees. In other embodiments, the tilt of the planes is at least ten (10) degrees. In other embodiments, the tilt of the planes is at least fifteen (15) degrees. In other embodiments, the tilt of the planes is at least twenty (20) degrees. In other embodiments, the tilt of the planes is at least twenty-five (25) degrees. In other embodiments, the tilt of the planes is at least thirty (30) degrees. In other embodiments, the tilt of the planes is at least thirty-five (35) degrees. In other embodiments, the tilt of the planes is at least forty (40) degrees. In other embodiments, the tilt of the planes is at least forty-five (45) degrees.

In some embodiments, a plurality of the coil loops of any of the embodiments described herein are overlapped such that the center points of two loops are separated by less than 75% of the diameter of the smaller of the two loops (or of the diameter of one loop if the diameters are the same). In some embodiments, a plurality of the coil loops of any of the embodiments described herein are overlapped such that the center points of two loops are separated by no more than 50% of the diameter of the smaller of the two loops (or of the diameter of one loop if the diameters are the same). In some embodiments, a plurality of the coil loops of any of the embodiments described herein are overlapped such that the center points of two loops are separated by no more than 33% of the diameter of the smaller of the two loops (or of the diameter of one loop if the diameters are the same). In some embodiments, a plurality of the coil loops of any of the embodiments described herein are overlapped such that the center points of two loops are separated by no more than 20% of the diameter of the smaller of the two loops (or of the diameter of one loop if the diameters are the same).

FIG. 1E2 is a slightly-tilted elevational-view block diagram of coil-loops system 105, showing different-size-circumference loop 111 and loop 129 that are coplanar (not separated from one another by a vertical distance from the patient being imaged), according to some embodiments of the present invention. Note that FIG. 1E2 is a slightly-tilted elevational-view because the geometric planes of both loops would show as a single line when viewed edge-on, which does not as clearly convey the idea shown here.

FIG. 1F1 is a plan-view block diagram of a coil-loops system 106 having a plurality of equal-size-circumference concentric coil loops 111 and loop 132 each connected to one of a plurality of RF receiver-electronics systems (e.g., capacitor 115, RF trap 116, preamplifier 117), according to some embodiments of the present invention. In some embodiments as shown here, the receiver electronics for the two loops are connected to the two loops on the same or nearly the same side (i.e., above-below one another). In other embodiments (not shown), the receiver electronics for the two loops are connected to the two loops on opposite or nearly opposite side (i.e., 180 degrees away from one another). In still other embodiments (not shown), a plurality of receiver electronics units are connected to each of the two loops, and are connected to the two loops on angularly separated or opposite sides (i.e., for example, two receiver electronics units connected to each loop, but 90 degrees away from one another, or three receiver electronics units connected to each loop, but 60 degrees away from one another).

FIG. 1F2 is a slightly-tilted elevational-view block diagram of coil-loops system 106, showing equal-size-circumference loop 111 and loop 132 separated from one another by a vertical distance from the patient being imaged, according to some embodiments of the present invention. Note the substrate layer of dielectric 149. In some embodiments, the two loops 111 and 132 are deposited on opposite major faces of substrate 149, to provide vertical separation (i.e., separation of the planes in a direction perpendicular to the surface of the patient.

FIG. 1G1 is a plan-view block diagram of a coil-loops system 107 having a plurality of different-size-circumference concentric coil loop 111, and a plurality of smaller loops 129 each connected to one of a plurality of receiver-electronics units (e.g., capacitor 115, RF trap 116, preamplifier 117), according to some embodiments of the present invention. In some embodiments, the plurality of output signals from the various receiver-electronics units are decoded to remove common-mode signals and to distinguish signals from a plurality of laterally offset volumes (under the plurality of laterally offset loops 129) of tissue being imaged, which is done by signal decoder 118.

FIG. 1G2 is a slightly-tilted elevational-view block diagram of coil-loops system 107, showing different-size-circumference loop 111 and the plurality of smaller loops 129 that are coplanar (not separated from one another by a vertical distance from the patient being imaged), according to some embodiments of the present invention.

FIG. 1H1 is a plan-view photograph of one embodiment of coil-loops system 105 (see FIG. 1E1 described above) having a plurality of different-size-circumference concentric coil loop 111 and loops 129 each connected to one of a plurality of receiver-electronics systems (e.g., capacitor 115, RF trap 116, preamplifier 117), according to some embodiments of the present invention.

FIG. 1H2 is an enlarged plan-view photograph of the embodiment of coil-loops system 105 having a plurality of different-size-circumference concentric coil loop 111 and loops 129 each connected to one of a plurality of receiver-electronics systems (e.g., the outer loop 111 having tuning capacitor 194, and a circuit board holding matching capacitor 115, RF trap 116, preamplifier 117, and the inner loop 129 having tuning capacitor 124, and a circuit board holding matching capacitor 125, RF trap 126, preamplifier 127), according to some embodiments of the present invention.

FIG. 2 is a plan-view block diagram of a coil-loops system 201 having a plurality of concentric coil loops 211, 212, 213, 214 each connected to one or more of a plurality of RF receiver-electronics systems (not shown), and optionally overlapping or partially overlapping with another plurality of concentric coil loops 281, 282, 283, 284 according to some embodiments of the present invention. System 201 is similar to system 101 of FIG. 1A, but while system 101 has a hexagonal array of coils (e.g., the six larger coil loops 123, 133, 143, 153, 163 and 173 that surround loop 113, and the six smaller coil loops 124, 134, 144, 154, 164 and 174 that surround loop 114, have centers at points that form hexagonal shapes), the coil loops of system 201 are on rectangular Cartesian coordinates (e.g., the eight smaller coil loops 215, 225, 235, 217, 237, 216, 226, and 236 that surround loop 214 have centers that form a rectangular grid).

FIG. 3A is a plan-view block diagram of a coil-loops system 301 having a plurality of sets of concentric equal-size-circumference coil loops (the set 310 having solid lines that includes loops 311 and 313, and the set 380 having dashed lines on thinner solid lines that includes loop 312 and 314) each connected to one of a plurality of RF receiver-electronics systems (not shown), according to some embodiments of the present invention. See FIG. 3B for a side view.

FIG. 3B is a slightly-tilted elevational-view block diagram of coil-loops system 301, showing sets of concentric equal-size-circumference, the set 310 that includes loops 311 and 313, and the set 380 that includes loop 312 and 314, separated from one another by a vertical distance difference 399 measured from the patient being imaged, according to some embodiments of the present invention. In some embodiments, the plane of set 380 is parallel to but separated from the plane of set 310 by a distance 399.

FIG. 4A is a plan-view block diagram of a coil-loops system 401 having a plurality of sets of non-concentric equal-size-circumference coil loops (the set 410 having solid lines that includes loops 411 and 413, and the set 480 having dashed lines on thinner solid lines that includes loop 412 and 414) each connected to one of a plurality of RF receiver-electronics systems (not shown), according to some embodiments of the present invention.

FIG. 4B is a slightly-tilted elevational-view block diagram of coil-loops system 401, showing sets of non-concentric equal-size-circumference, the set 410 having solid lines that includes loops 411 and 413, and the set 480 having dashed lines on thinner solid lines that includes loop 412 and 414, separated from one another by a vertical distance difference 499 measured from the patient being imaged, according to some embodiments of the present invention. In some embodiments, the plane of set 480 is parallel to but separated from the plane of set 410 by a distance 499.

Figure 5A:
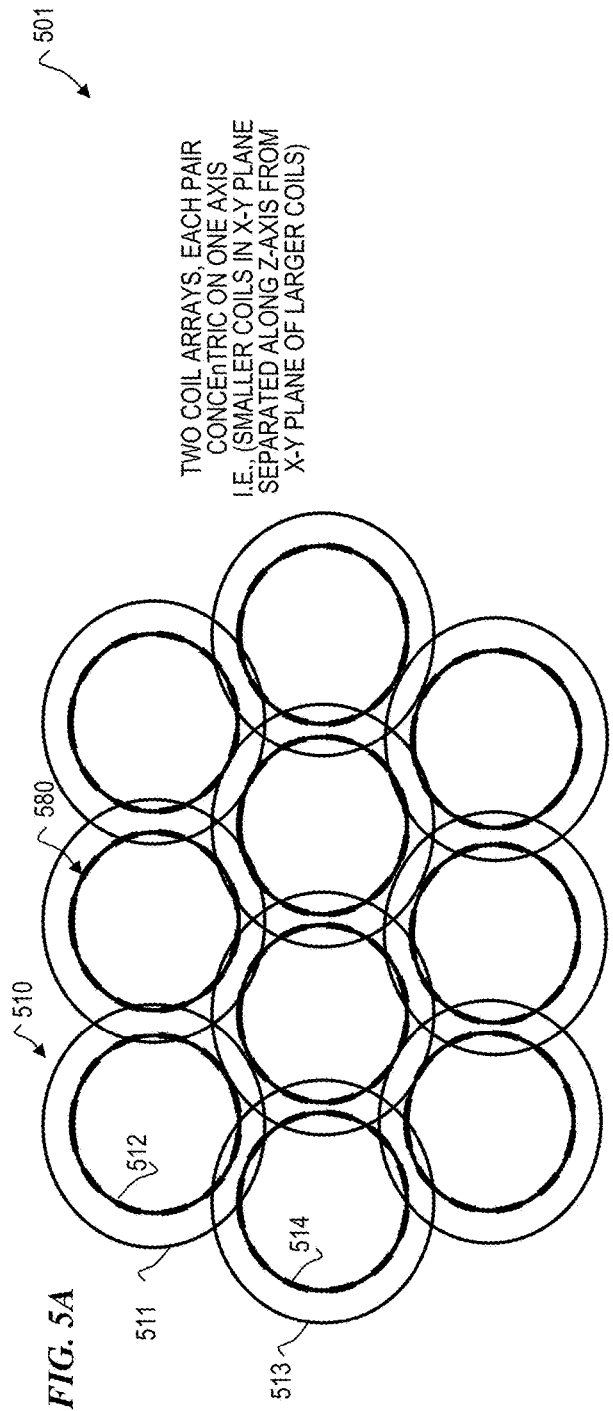
FIG. 5A is a plan-view block diagram of a coil-loops system 501 having a plurality of sets of concentric different-size-circumference coil loops (the set that includes loops 511 and 513, and the set that includes loop 512 and 514) each connected to one of a plurality of RF receiver-electronics systems (not shown), according to some embodiments of the present invention.

FIG. 5A is a plan-view block diagram of a coil-loops system 501 having a plurality of sets of concentric different-size-circumference coil loops (the set that includes loops 511 and 513, and the set that includes loop 512 and 514) each connected to one of a plurality of RF receiver-electronics systems (not shown), according to some embodiments of the present invention.

Figure 5B:
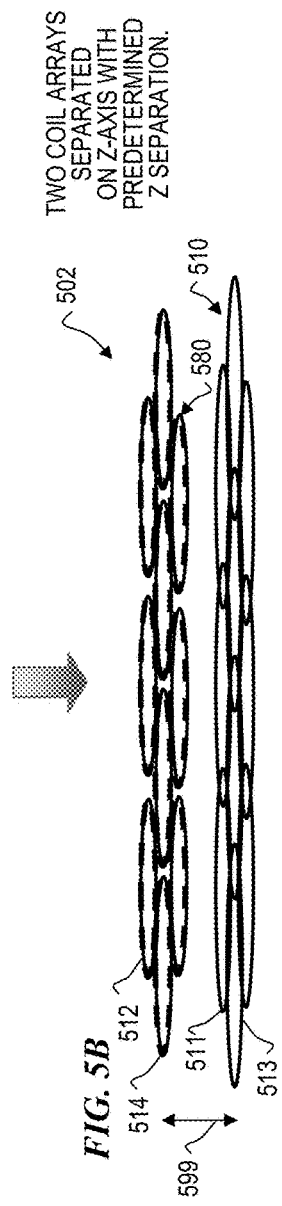
FIG. 5B is a slightly-tilted elevational-view block diagram of coil-loops system 502, showing sets of concentric different-size-circumference, the set that includes loops 511 and 513, and the set that includes loop 512 and 514, separated from one another by a vertical distance difference 599 measured from the patient being imaged, according to some embodiments of the present invention.

FIG. 5B is a slightly-tilted elevational-view block diagram of coil-loops system 502, (system 502 will have the plan view as system 501 shown in FIG. 5A) showing sets of concentric different-size-circumference, the set that includes loops 511 and 513, and the set that includes loop 512 and 514, separated from one another by a vertical distance difference 599 measured from the patient being imaged, according to some embodiments of the present invention. In some embodiments, the plane of set 580 is parallel to but separated from the plane of set 510 by a distance 599.

Figure 5C:
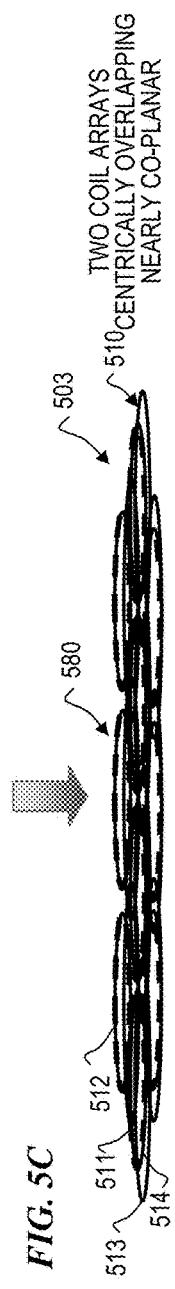
FIG. 5C is a slightly-tilted elevational-view block diagram of coil-loops system 503, showing sets of concentric different-size-circumference, the set that includes loops 511 and 513, and the set that includes loop 512 and 514, that are co-planar (not separated from one another by a vertical distance measured from the patient being imaged), according to some embodiments of the present invention.

FIG. 5C is a slightly-tilted elevational-view block diagram of coil-loops system 503, (system 503 will have the plan view as system 501 shown in FIG. 5A) showing sets of concentric different-size-circumference, the set that includes loops 511 and 513, and the set that includes loop 512 and 514, that are co-planar (not separated from one another by a vertical distance measured from the patient being imaged), according to some embodiments of the present invention. In some embodiments, the plane of set 580 is co-planar with (not separated from) the plane of set 510.

Figure 6:
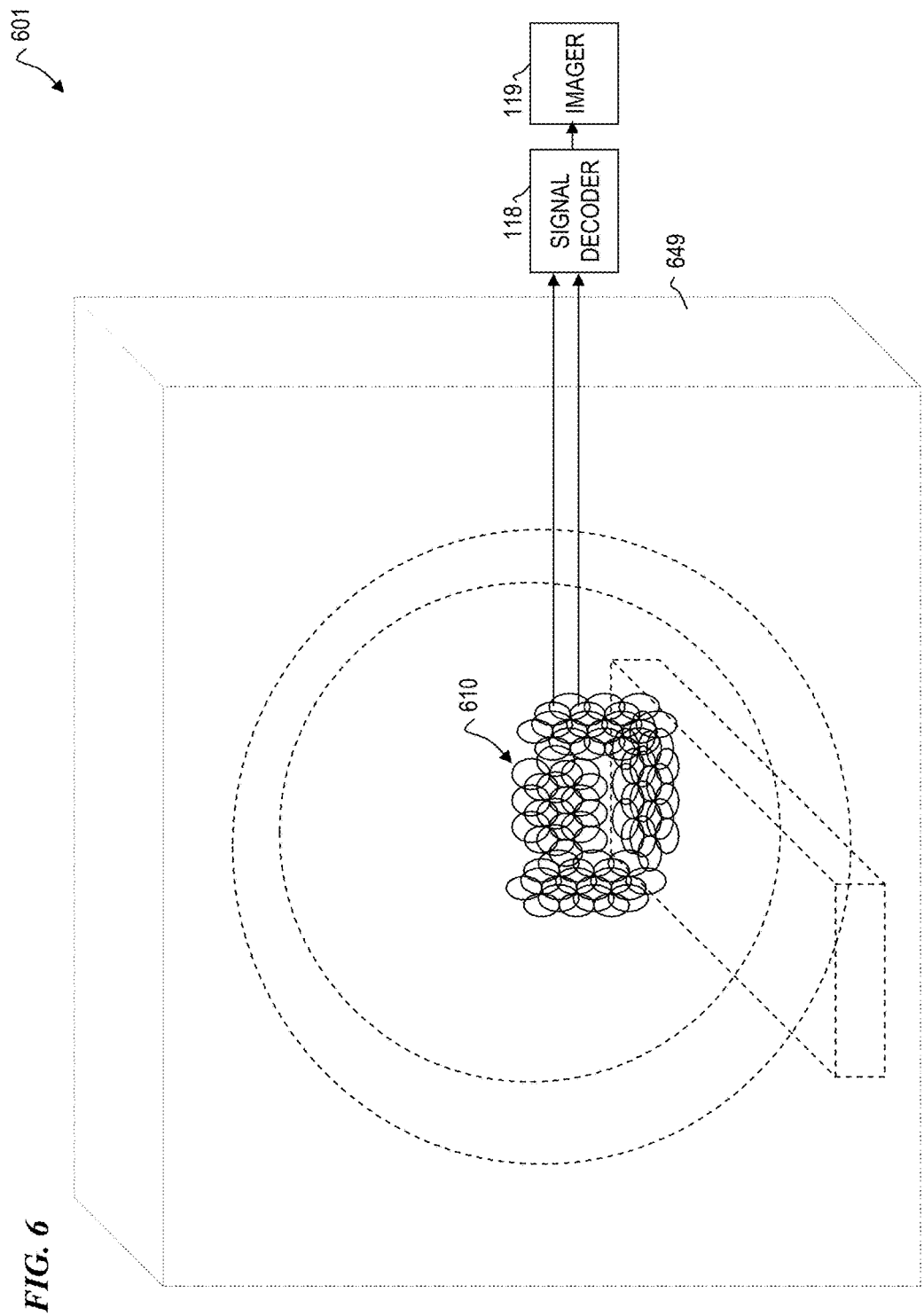
FIG. 6 is a perspective-view block diagram of a MRI system 601 having a plurality of sets of coil loops each connected to one or more of a plurality of RF receiver-electronics systems (not shown), according to some embodiments of the present invention.

FIG. 6 is a perspective-view block diagram of a MRI system 601 having a plurality of sets of coil loops each connected to one or more of a plurality of RF receiver-electronics systems (not shown), according to some embodiments of the present invention. In some embodiments, system 601 includes a coil receiver system 610 (e.g., a plurality of coil loops and receiver electronics units as described in any one or more of the other figures and descriptions herein) is placed in the bore of MRI magnet unit 640, and the signals from the plurality of coil loops and receiver electronics units are decoded and imaged by units 118 and 119.

Figure 7:
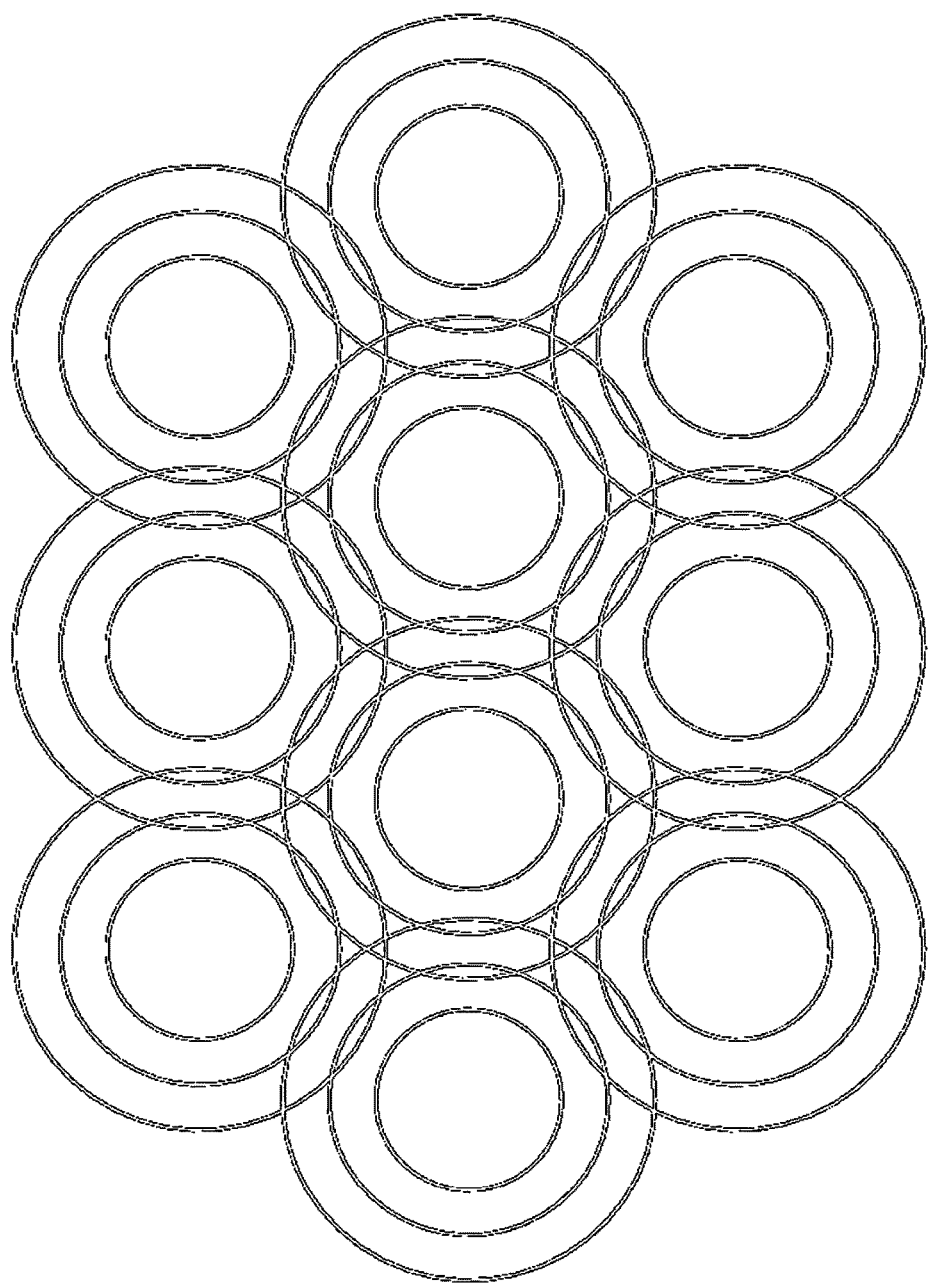
FIG. 7 is a plan-view block diagram of coil-loops system 701, showing sets of concentric different-size-circumference loops, that are either co-planar or separated from one another by a vertical distance difference measured from the patient being imaged, according to some embodiments of the present invention.

FIG. 7 is a plan-view block diagram of coil-loops system 701, showing sets of concentric different-size-circumference loops, that are either co-planar or separated from one another by a vertical distance difference measured from the patient being imaged, according to some embodiments of the present invention.

Figure 8:
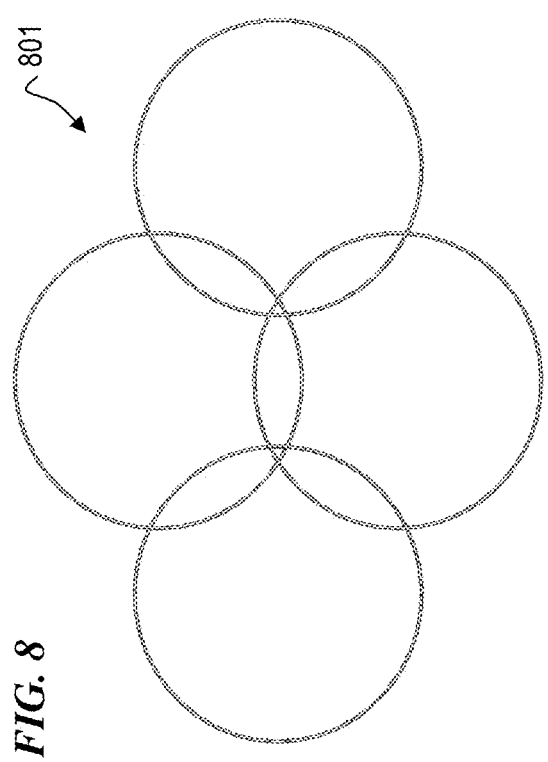
FIG. 8 is a plan-view block diagram of coil-loops system 801, showing sets of equal-size-circumference loops, that are either co-planar or separated from one another by a vertical distance difference measured from the patient being imaged, according to some embodiments of the present invention.

FIG. 8 is a plan-view block diagram of coil-loops system 801, showing sets of equal-size-circumference loops, that are either co-planar or separated from one another by a vertical distance difference measured from the patient being imaged, according to some embodiments of the present invention.

Figure 9A:
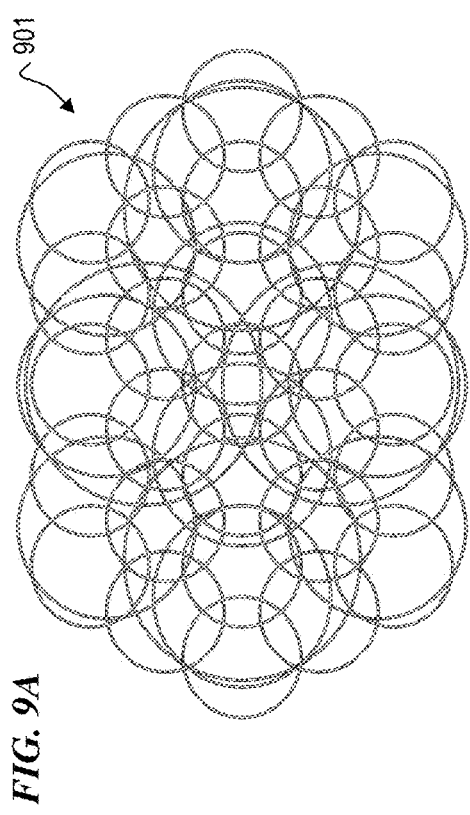
FIG. 9A is a plan-view block diagram of coil-loops system 901, showing sets of non-concentric different-size-circumference loops, that are either co-planar or separated from one another by a vertical distance difference measured from the patient being imaged, according to some embodiments of the present invention.

FIG. 9A is a plan-view block diagram of coil-loops system 901, showing sets of non-concentric different-size-circumference loops, that are either co-planar or separated from one another by a vertical distance difference measured from the patient being imaged, according to some embodiments of the present invention.

Figure 9C:
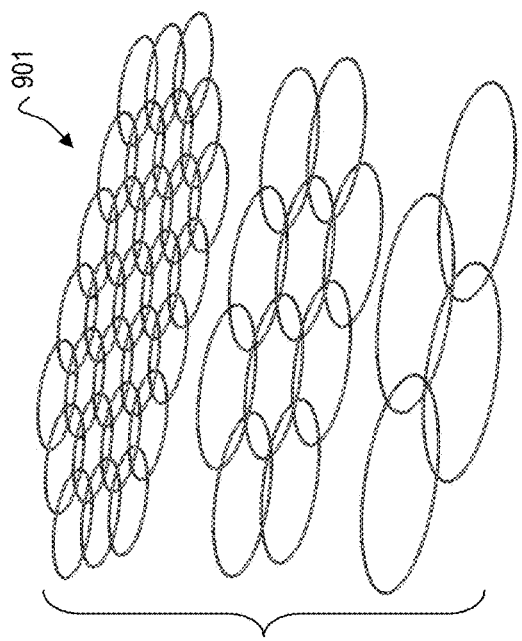
FIG. 9C is a perspective-view block diagram of coil-loops system 901, showing sets of non-concentric different-size-circumference loops, that are either co-planar or separated from one another by a vertical distance difference measured from the patient being imaged, according to some embodiments of the present invention.
Figure 9B:
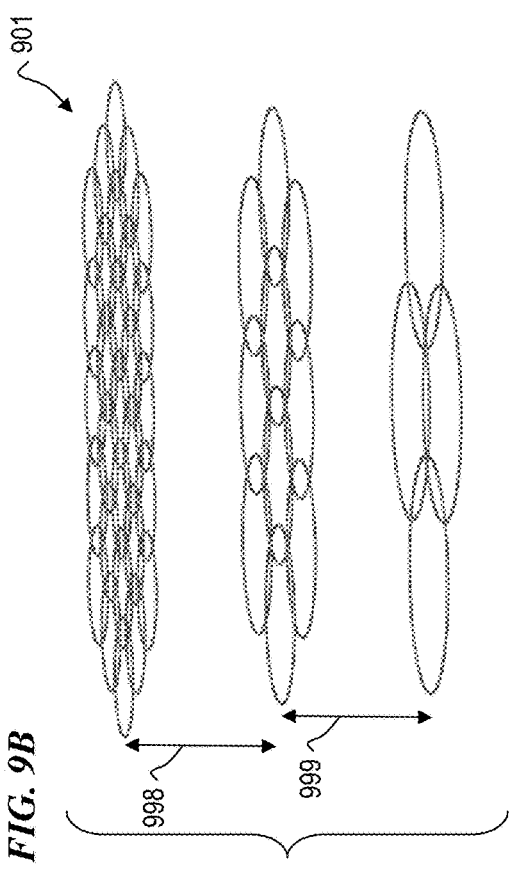
FIG. 9B is a slightly-tilted elevational-view block diagram of coil-loops system 901, showing sets of non-concentric different-size-circumference loops, that are either co-planar or separated from one another by a vertical distance difference measured from the patient being imaged, according to some embodiments of the present invention.

FIG. 9B is a slightly-tilted elevational-view block diagram of coil-loops system 901, showing sets of non-concentric different-size-circumference loops, that are either co-planar or separated from one another by a vertical distance difference measured from the patient being imaged, according to some embodiments of the present invention.

FIG. 9C is a perspective-view block diagram of coil-loops system 901, showing sets of non-concentric different-size-circumference loops, that are either co-planar or separated from one another by a vertical distance difference measured from the patient being imaged, according to some embodiments of the present invention.

Figure 10:
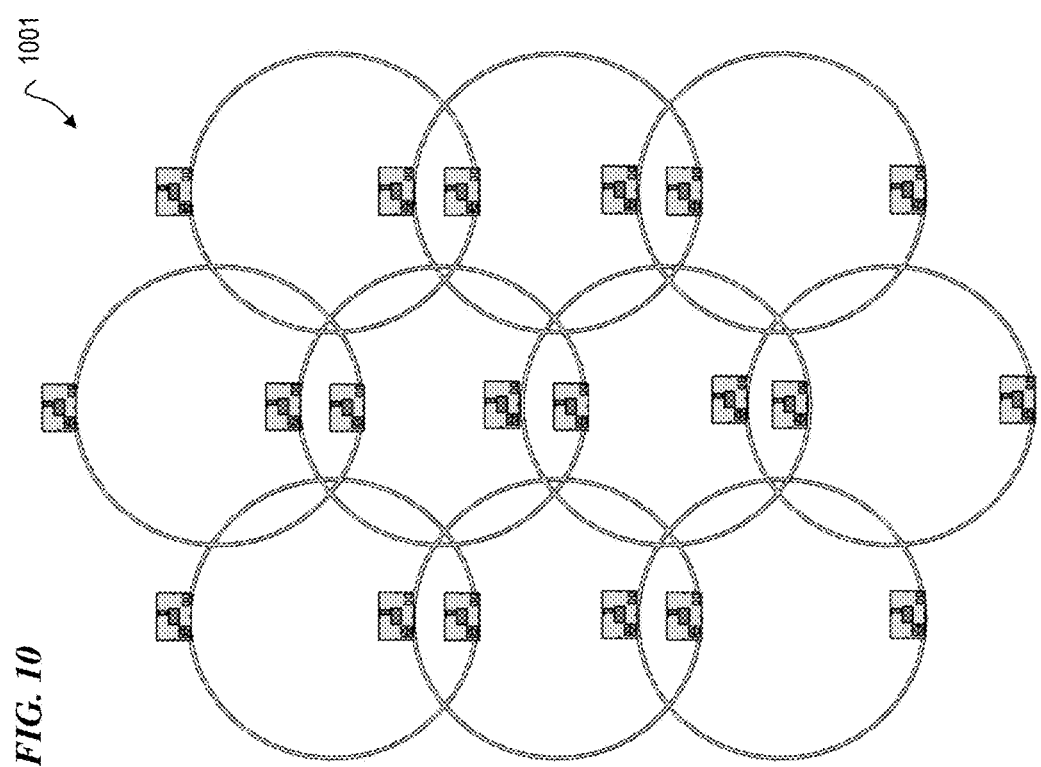
FIG. 10 is a plan-view block diagram of coil-loops system 1001, showing sets of non-concentric equal-size-circumference loops, that are either co-planar or separated from one another by a vertical distance difference measured from the patient being imaged, according to some embodiments of the present invention.

FIG. 10 is a plan-view block diagram of coil-loops system 1001, showing sets of non-concentric equal-size-circumference loops, that are either co-planar or separated from one another by a vertical distance difference measured from the patient being imaged, according to some embodiments of the present invention. In some embodiments, two receiver electronics units are connected to each one of the plurality of receiver coil loops, and the outputs of these are connected to decoder and imager units such as shown and described for other figures herein.

Figure 11A:
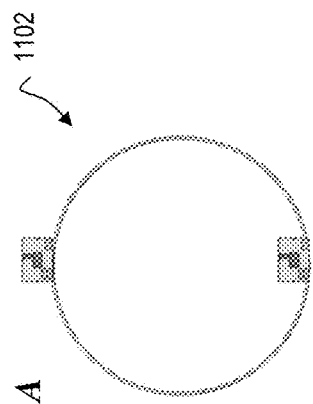
FIG. 11A is a plan-view block diagram of a single coil loop 1102 connected to two receiver-electronics systems, according to some embodiments of the present invention.

FIG. 11A is a plan-view block diagram of a single coil loop 1102 connected to two spaced-apart receiver-electronics systems, according to some embodiments of the present invention.

Figure 11B:
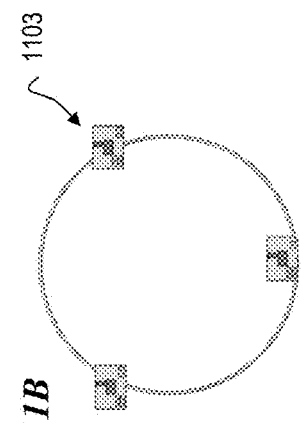
FIG. 11B is a plan-view block diagram of a single coil loop 1103 connected to three receiver-electronics systems, according to some embodiments of the present invention.

FIG. 11B is a plan-view block diagram of a single coil loop 1103 connected to three spaced-apart receiver-electronics systems, according to some embodiments of the present invention.

Figure 11C:
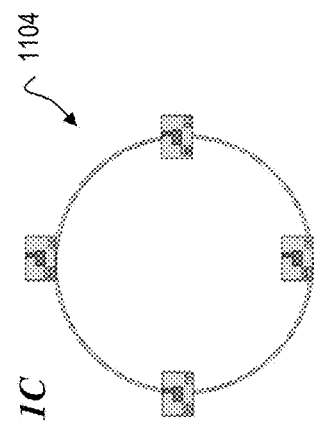
FIG. 11C is a plan-view block diagram of a single coil loop 1104 connected to four receiver-electronics systems, according to some embodiments of the present invention.

FIG. 11C is a plan-view block diagram of a single coil loop 1104 connected to four spaced-apart receiver-electronics systems, according to some embodiments of the present invention.

Figures 12A, 12B:
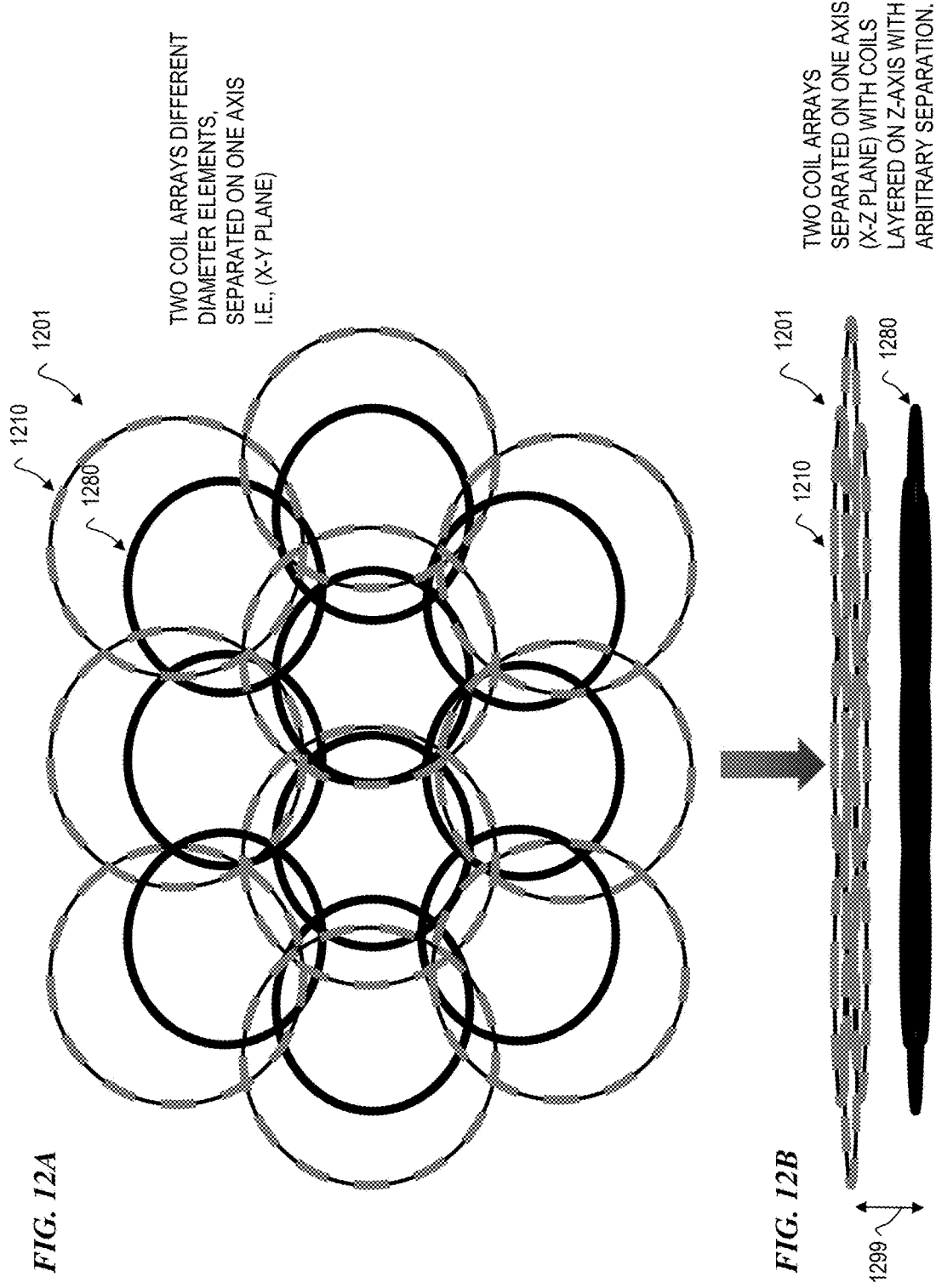
FIG. 12A is a plan-view block diagram of a coil-loops system 1201 having a plurality of sets of concentric different-size-circumference coil loops (the set 1210 and the set 1280) each connected to one of a plurality of RF receiver-electronics systems (not shown), according to some embodiments of the present invention.
FIG. 12B is a slightly-tilted elevational-view block diagram of coil-loops system 1201 having a plurality of sets of concentric different-size-circumference coil loops (the set 1210 and the set 1280), separated from one another by a vertical distance difference 1299 measured from the patient being imaged, according to some embodiments of the present invention.

FIG. 12A is a plan-view block diagram of a coil-loops system 1201 having a plurality of sets of concentric different-size-circumference coil loops (the set 1210 and the set 1280) each connected to one of a plurality of RF receiver-electronics systems (not shown), according to some embodiments of the present invention.

FIG. 12B is a slightly-tilted elevational-view block diagram of coil-loops system 1201 having a plurality of sets of concentric different-size-circumference coil loops (the set 1210 and the set 1280), separated from one another by a vertical distance difference 1299 measured from the patient being imaged, according to some embodiments of the present invention.

The Figures herein show substantially circular coil loops that are used in some embodiments. In other embodiments, square coil loops, rectangular coil loops, pentagonal and/or hexagonal coil loops, or other geometric shapes are used. In some embodiments, combinations of different geometric shapes are used for the coil loops.

In some embodiments, the present invention provides an apparatus for receiving radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from otherwise cross-coupled coil loops and to improve signal-to-noise ratio (SNR) of the received signal. This apparatus includes a substrate; a plurality of receiver-electronics units mounted on the substrate, each generating an output signal; a plurality of RF receiver units affixed to the substrate, each one of the plurality of RF receiver units including an antenna loop connected to at least one of the plurality of receiver-electronics units; and decoder electronics operatively coupled to the plurality of RF receiver units and configured to remove common-mode signals from the output signals from the plurality of RF receiver units.

In some embodiments, each of the plurality of RF receiver units further includes: a frequency-tuning capacitor, an impedance-matching capacitor, an RF trap, and a preamplifier.

In some embodiments, each of the plurality of RF receiver units further includes: a least one frequency-tuning capacitor, a plurality of impedance-matching capacitors, a plurality of RF traps, and a plurality of preamplifiers.

In some embodiments, the present invention provides an apparatus for receiving radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from otherwise cross-coupled coil loops and to improve signal-to-noise ratio (SNR) of the received signal. The apparatus includes a substrate having a first major surface and a second major surface; a first plurality of receiver-electronics units mounted on the substrate, wherein the first plurality of receiver-electronics units includes a first receiver-electronics unit and a second receiver-electronics unit, and wherein each one of the first plurality of receiver-electronics units generates an output signal; a plurality of RF receiver units affixed to the substrate, wherein the plurality of RF receiver units includes a first RF receiver unit having a first antenna loop that is connected to the first receiver-electronics unit and a second RF receiver unit having a second antenna loop that is connected to the first receiver-electronics unit; and decoder electronics operatively coupled to receive the output signals from the plurality of RF receiver units and configured to remove common-mode signals from the output signals from the plurality of RF receiver units.

In some embodiments, each of the plurality of RF receiver units further includes a frequency-tuning capacitor, an impedance-matching capacitor, an RF trap, and a preamplifier.

In some embodiments, each of the plurality of RF receiver units further includes a least one frequency-tuning capacitor, a plurality of impedance-matching capacitors, a plurality of RF traps, and a plurality of preamplifiers.

In some embodiments, the first antenna loop is affixed to the first major surface of the substrate and the second antenna loop is affixed to the second major surface such that the first antenna loop overlaps the second antenna loop such that a line perpendicular to the first major surface and passing through a center point of the first antenna loop is laterally offset from a center point of the second antenna loop. In some such embodiments, the apparatus further includes a second plurality of receiver-electronics units mounted on the substrate, wherein the second plurality of receiver-electronics units includes a third receiver-electronics unit operatively coupled to receive signals from the first antenna loop and a fourth receiver-electronics unit operatively coupled to receive signals from the second antenna loop, and wherein each one of the first plurality of receiver-electronics units generates its respective output signal and each one of the second plurality of receiver-electronics units generates its respective output signal, and the respective output signals are combined and decoded by the decoder electronics.

In some embodiments, the first antenna loop is affixed to the first major surface of the substrate and the second antenna loop is affixed to the second major surface and centered over the first antenna loop such that a center point of the first antenna loop and a center point of the second antenna loop are both located on a single line perpendicular to the first major surface.

In some embodiments, the first antenna loop is affixed to the first major surface of the substrate and the second antenna loop is affixed to the second major surface and laterally offset from the first antenna loop such that a center point of the first antenna loop and a center point of the second antenna loop are each located on one of two spaced-apart lines perpendicular to the first major surface.

In some embodiments, the first antenna loop is affixed to the first major surface of the substrate and the second antenna loop is affixed to the first major surface and centered relative to the first antenna loop such that a center point of the first antenna loop and a center point of the second antenna loop are located within two millimeters from one another, and wherein the first antenna loop and the first antenna loop are substantially coplanar.

In some embodiments, the first antenna loop is affixed to the first major surface of the substrate and the second antenna loop is affixed to the first major surface and laterally offset relative to the first antenna loop, and wherein the first antenna loop and the first antenna loop are substantially coplanar and have sizes that differ by more than ten percent.

In some embodiments, the first antenna loop is affixed to the first major surface of the substrate and the second antenna loop is oriented such that a plane of the second antenna loop is at an angle of at least ten degrees from a plane of the first antenna loop and centered relative to the first antenna loop such that a center point of the first antenna loop and a center point of the second antenna loop are located within two millimeters from one another.

In some embodiments, the present invention provides a method for receiving radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from otherwise cross-coupled coil loops and to improve signal-to-noise ratio (SNR) of the received signal. This method includes providing a substrate, a plurality of receiver-electronics units mounted on the substrate, each generating an output signal, a plurality of RF receiver units affixed to the substrate, each one of the plurality of RF receiver units including an antenna loop having a resonance frequency and connected to at least one of the plurality of receiver-electronics units, and decoder electronics operatively coupled to the plurality of RF receiver units; receiving RF MRI signals with the antenna loops; pre-amplifying the received RF MRI signals to generate output signals; and removing common-mode signals from the output signals.

Some embodiments of the method further include automatically adjusting electrical parameters of the receiver-electronics units to adjust their resonance frequency.

Some embodiments of the method further include automatically adjusting electrical parameters of the receiver-electronics units to adjust the resonance frequency by moving a non-magnetic mechanical-movement device.

In some embodiments of the method, the receiver-electronics units each includes a plurality of pi networks arranged at different radial directions around a shielded RF cable.

In some embodiments, the present invention provides a method for receiving radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from otherwise cross-coupled coil loops and to improve signal-to-noise ratio (SNR) of the received signal. This method includes providing a substrate, a plurality of receiver-electronics units mounted on the substrate, each generating an output signal, and a plurality of RF receiver units affixed to the substrate, each one of the plurality of RF receiver units including an antenna loop having a resonance frequency and connected to at least one of the plurality of receiver-electronics units, and decoder electronics operatively coupled to the plurality of RF receiver units; receiving RF MRI signals with the antenna loops; pre-amplifying the received RF MRI signals to generate output signals; and removing common-mode signals from the output signals.

In some embodiments, the method further includes automatically adjusting electrical parameters of the receiver-electronics units to adjust their resonance frequency.

In some embodiments, the method further includes automatically adjusting electrical parameters of the receiver-electronics units to adjust the resonance frequency by moving a non-magnetic mechanical-movement device.

In some embodiments, the method further includes affixing the first antenna loop to the first major surface of the substrate; and affixing the second antenna loop to the second major surface such that the first antenna loop overlaps the second antenna loop such that a line perpendicular to the first major surface and passing through a center point of the first antenna loop is laterally offset from a center point of the second antenna loop. In some such embodiments, the method also further includes providing a second plurality of receiver-electronics units mounted on the substrate, wherein the second plurality of receiver-electronics units includes a third receiver-electronics unit and a fourth receiver-electronics unit; operatively coupling the third receiver-electronics to receive signals from the first antenna loop; operatively coupling the fourth receiver-electronics unit to receive signals from the second antenna loop; generating respective output signals from each one of the first plurality of receiver-electronics units and each one of the second plurality of receiver-electronics units; and combining and decoding the respective output signals to generate an MRI image.

In some embodiments, the method further includes affixing the first antenna loop to the first major surface of the substrate; and affixing the second antenna loop to the second major surface of the substrate centered over the first antenna loop such that a center point of the first antenna loop and a center point of the second antenna loop are both located on a single line perpendicular to the first major surface.

In some embodiments, the method further includes affixing first antenna loop to the first major surface of the substrate; and affixing the second antenna loop to the second major surface of the substrate laterally offset from the first antenna loop such that a center point of the first antenna loop and a center point of the second antenna loop are each located on one of two spaced-apart lines perpendicular to the first major surface.

In some embodiments, the method further includes affixing first antenna loop to the first major surface of the substrate; and affixing the second antenna loop to the first major surface centered relative to the first antenna loop such that a center point of the first antenna loop and a center point of the second antenna loop are located within two millimeters from one another, and wherein the first antenna loop and the first antenna loop are substantially coplanar and differing in circumference by at least ten percent.

In some embodiments, the method further includes affixing the first antenna loop to the first major surface of the substrate; and affixing the second antenna loop to the first major surface laterally offset relative to the first antenna loop, and wherein the first antenna loop and the first antenna loop are substantially coplanar and have circumference sizes that differ by at least ten percent.

In some embodiments, the method further includes affixing the first antenna loop to the first major surface of the substrate; and positioning the second antenna loop such that a plane of the second antenna loop is oriented at an angle of at least ten degrees from a plane of the first antenna loop and centered relative to the first antenna loop such that a center point of the first antenna loop and a center point of the second antenna loop are located within two millimeters from one another.

In some embodiments, the present invention provides a non-transitory computer-readable medium having instructions stored thereon for causing a suitably programmed information processor to execute a method that includes receiving RF MRI signals with a plurality of antenna loops mounted to a substrate; pre-amplifying the received RF MRI signals using a plurality of receiver-electronics units to generate output signals; and removing common-mode signals from the output signals. In some embodiments, the medium contains instructions such that the method further includes using a feedback signal operatively coupled to the programmable information-processing device to provide feedback control in order to maintain an electrical parameter of the plurality of receiver-electronics units. In some embodiments, the medium contains instructions such that the method further includes controlling resistance, inductance and capacitance (RLC) values of the plurality of receiver-electronics units.

In some embodiments, the present invention provides a non-transitory computer-readable medium having instructions stored thereon for causing a suitably programmed information processor to execute a method that includes: autocontrolling an electrical parameter of each of a plurality of receiver-electronics units that is mounted to a MRI receiver coil unit. In some embodiments, the medium contains instructions such that the method further includes using a feedback signal operatively coupled to the programmable information-processing device to provide feedback control in order to maintain the electrical parameter of the plurality of receiver-electronics units. In some embodiments, the medium contains instructions such that the method further includes controlling resistance, inductance and capacitance (RLC) values of the plurality of receiver-electronics units.

In some embodiments, the present invention provides a non-transitory computer-readable medium having instructions stored thereon for causing a suitably programmed information processor to execute a method that comprises: autocontrolling an electrical parameter of an LC circuit that is mounted to a case of a snap-on balun attached to a shielded RF cable that has a peripheral shield conductor and at least one inner conductor for carrying RF signals, wherein the LC circuit has a resonance frequency at a frequency of RF signals carried on the at least one inner conductor, wherein the case includes a piercing structure electrically connected to the LC circuit and configured to pierce and electrically connect the LC circuit to the shield conductor of the shielded RF cable.

In some embodiments of the computer-readable medium, the method further includes using a feedback signal operatively coupled to the programmable information-processing device to provide feedback control in order to maintain the electrical parameter of the LC circuit.

In some embodiments of the computer-readable medium, the method further includes controlling resistance, inductance and capacitance (RLC) values of the LC circuit.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An apparatus for receiving radio-frequency (RF) signals suitable for magnetic-resonance imaging (MRI) from radio-frequency (RF) antenna loops that are overlapped and/or concentric, in order to receive signal and improve signal-to-noise ratio (SNR) of the received signal, the apparatus comprising:
    a substrate having a first major surface and a second major surface;
    a plurality of pairs of RF antenna loops affixed to the substrate including:
        a first pair of RF antenna loops,
        a second pair of RF antenna loops, and
        a third pair of RF antenna loops,
            wherein each pair of RF antenna loops in the plurality of pairs of RF antenna loops includes a first RF antenna loop and a second RF antenna loop located such that a center point of the first antenna loop and a center point of the second antenna loop are both located on a single line perpendicular to a plane of the first RF antenna loop,
            wherein the first pair of RF antenna loops and the second pair of RF antenna loops are partially overlapped with one another,
            wherein the first pair of RF antenna loops and the third pair of RF antenna loops are partially overlapped with one another, and
            wherein the second pair of RF antenna loops and the third pair of RF antenna loops are partially overlapped with one another;
    a first plurality of pairs of RF receiver units affixed to the substrate including:
        a first pair of RF receiver units connected to receive signals from the first pair of RF antenna loops,
        a second pair of RF receiver units connected to receive signals from the second pair of RF antenna loops, and
        a third pair of RF receiver units connected to receive signals from the third pair of RF antenna loops,
            wherein each one of the first plurality of pairs of RF receiver units includes:
                a first RF receiver unit operatively connected to the first RF antenna loop of the corresponding pair of RF antenna loops, and
                a second RF receiver unit operatively connected to the second RF antenna loop of the corresponding pair of RF antenna loops; and
    a first plurality of electronics units mounted on the substrate, wherein the first plurality of electronics units includes:
        a first electronics unit connected to receive and add signals from the first pair of RF receiver units,
        a second electronics unit connected to receive and add signals from the second pair of RF receiver units, and
        a third electronics unit connected to receive and add signals from the third pair of RF receiver units, and
    wherein each one of the first plurality of electronics units adds the signals from the corresponding pair of RF receiver units in order to generate a decoded output signal that has improved SNR to form a first plurality of output signals; and
    electronics operatively coupled to receive the first plurality of output signals from the first plurality of electronics units and configured to process the first plurality of output signals to generate MRI image slices of a patient being imaged.

2. A method for receiving radio-frequency (RF) signals suitable for magnetic-resonance imaging (MRI) from radio-frequency (RF) antenna loops that are overlapped and/or concentric, in order to receive signal and improve signal-to-noise ratio (SNR) of the received signal, the method comprising:
    providing a substrate,
    mounting a plurality of pairs of antenna loops mounted to the substrate including:
        a first pair of RF antenna loops,
        a second pair of RF antenna loops, and
        a third pair of RF antenna loops,
            wherein each pair of RF antenna loops in the plurality of pairs of RF antenna loops includes a first RF antenna loop and a second RF antenna loop located such that a center point of the first antenna loop and a center point of the second antenna loop are both located on a single line perpendicular to a plane of the first RF antenna loop,
            wherein the first pair of RF antenna loops and the second pair of RF antenna loops are partially overlapped with one another,
            wherein the first pair of RF antenna loops and the third pair of RF antenna loops are partially overlapped with one another, and
            wherein the second pair of RF antenna loops and the third pair of RF antenna loops are partially overlapped with one another;
    affixing a plurality of pairs of RF amplifiers to the substrate including:
        a first pair of RF amplifiers connected to receive signals from the first pair of RF antenna loops,
        a second pair of RF amplifiers connected to receive signals from the second pair of RF antenna loops, and
        a third pair of RF amplifiers connected to receive signals from the third pair of RF antenna loops,
    wherein each one of the plurality of pairs of RF amplifiers includes:
        a first RF amplifier operatively connected to the first RF antenna loop of the corresponding pair of RF antenna loops, and
        a second RF amplifier operatively connected to the second RF antenna loop of the corresponding pair of RF antenna loops; and
    mounting a first plurality of electronics units on the substrate, wherein the first plurality of receiver-electronics units includes:
        a first electronics unit connected to receive and add signals from the first pair of RF amplifiers, a second electronics unit connected to receive and add signals from the second pair of RF amplifiers, and a third electronics unit connected to receive and add signals from the third pair of RF amplifiers, and adding, by each respective electronics unit, the signals from the respective corresponding pair of RF amplifiers and generating corresponding output signal to form a first plurality of output signals, wherein each one of the plurality of pairs of RF receiver units corresponds to one of the plurality of pairs of antenna loops;

receiving RF MRI signals with the plurality of pairs of antenna loops;

pre-amplifying the received RF MRI signals using the plurality of pairs of RF amplifiers to generate the first plurality of pairs of output signals;

for each respective pair of the first plurality of pairs of output signals, adding the pair of signals to one another in order to generate a decoded signal that has improved SNR; and processing the decoded signals to generate MRI image slices of a patient being imaged.

3. A non-transitory computer-readable medium having instructions stored thereon for causing a suitably programmed information processor to execute a method, wherein the method is suitable for an apparatus that includes:

a substrate having a first major surface and a second major surface, a plurality of pairs of RF antenna loops affixed to the substrate including:

a first pair of RF antenna loops, a second pair of RF antenna loops, and a third pair of RF antenna loops, wherein each pair of RF antenna loops in the plurality of pairs of RF antenna loops includes a first RF antenna loop and a second RF antenna loop located such that a center point of the first antenna loop and a center point of the second antenna loop are both located on a single line perpendicular to a plane of the first RF antenna loop, wherein the first pair of RF antenna loops and the second pair of RF antenna loops are partially overlapped with one another, wherein the first pair of RF antenna loops and the third pair of RF antenna loops are partially overlapped with one another, and wherein the second pair of RF antenna loops and the third pair of RF antenna loops are partially overlapped with one another;

a plurality of pairs of RF receiver units affixed to the substrate including:

a first pair of RF receiver units connected to receive signals from the first pair of RF antenna loops, a second pair of RF receiver units connected to receive signals from the second pair of RF antenna loops, and a third pair of RF receiver units connected to receive signals from the third pair of RF antenna loops, wherein each one of the plurality of pairs of RF receiver units includes:

a first RF receiver unit operatively connected to the first RF antenna loop of the corresponding pair of RF antenna loops, and a second RF receiver unit operatively connected to the second RF antenna loop of the corresponding pair of RF antenna loops; and a first plurality of receiver-electronics units mounted on the substrate, wherein the first plurality of receiver-electronics units includes:

a first receiver-electronics unit connected to receive and add signals from the first pair of RF receiver units, a second receiver-electronics unit connected to receive and add signals from the second pair of RF receiver units, and a third receiver electronics unit connected to receive and add signals from the third pair of RF receiver units, and wherein the method comprises:

receiving RF MRI signals with the plurality of pairs of antenna loops mounted to the substrate;

pre-amplifying the received RF MRI signals using the plurality of pairs of RF receiver units to generate a first plurality of pairs of output signals;

adding the signals from the corresponding pair of RF receiver units the first plurality of output signals to one another in order to generate a decoded signal that has improved SNR; and decoding the respective output signals to generate an MRI image of a patient.

4. The apparatus of claim 1, wherein each RF receiver unit of the plurality of pairs of RF receiver units further includes:

a frequency-tuning capacitor, an impedance-matching capacitor, an RF trap, and a preamplifier.

5. The apparatus of claim 1, wherein each RF receiver unit of the plurality of pairs of RF receiver units further includes:

a least one frequency-tuning capacitor, a plurality of impedance-matching capacitors, a plurality of RF traps, and a plurality of preamplifiers.

6. The apparatus of claim 1, wherein the first antenna loop is affixed to the first major surface of the substrate and the second antenna loop is affixed to the second major surface, wherein the first antenna loop and the second antenna loop are substantially equal in size.

7. The apparatus of claim 1, further comprising:

a second plurality of pairs of RF receiver units mounted on the substrate, wherein the second plurality of pairs of RF receiver of pairs of RF receiver of pairs of RF receiver units includes a third of RF receiver unit operatively coupled to receive signals from the first antenna loop and a fourth RF receiver unit operatively coupled to receive signals from the second antenna loop, and wherein each of the first plurality of pairs of RF receiver units generates its respective output signal and each of the second plurality of pairs of RF receiver units generates its respective output signal, and the respective output signals are combined and decoded by the decoder electronics.

8. The apparatus of claim 1, wherein, for each pair of RF antenna loops in the plurality of pairs of RF antenna loops, the first antenna loop is affixed to the first major surface of the substrate and the second antenna loop is affixed to the second major surface and centered over the first antenna loop such that a center point of the first antenna loop and a center point of the second antenna loop are both located on a single line perpendicular to the first major surface.

9. The apparatus of claim 1, wherein, for each pair of RF antenna loops in the plurality of pairs of RF antenna loops, the first antenna loop is affixed to the first major surface of the substrate and the second antenna loop is affixed to the first major surface and centered relative to the first antenna loop such that a center point of the first antenna loop and a center point of the second antenna loop are located within two millimeters from one another, and wherein the first antenna loop and the first antenna loop are substantially coplanar.

10. The apparatus of claim 1, wherein, for at least one pair of RF antenna loops in the plurality of pairs of RF antenna loops, the first antenna loop is affixed to the first major surface of the substrate and the second antenna loop is oriented such that a plane of the second antenna loop is at an angle of at least ten degrees from a plane of the first antenna loop and centered relative to the first antenna loop such that a center point of the first antenna loop and a center point of the second antenna loop are located within two millimeters from one another.

11. The apparatus of claim 1, wherein, for each pair of RF antenna loops of the plurality of pairs of antenna loops, the first antenna loop and the second antenna loop have equal sizes and shapes.

12. The apparatus of claim 1, wherein, for each pair of RF antenna loops of the plurality of pairs of antenna loops, the first antenna loop and the second antenna loop are concentric, and wherein the second antenna loop is smaller than the first antenna loop.

13. The apparatus of claim 1, wherein, for each pair of RF antenna loops of the plurality of pairs of antenna loops, a corresponding one the first plurality of receiver-electronics units further includes a third receiver-electronics unit that is connected to the first antenna loop.

14. The apparatus of claim 1, wherein, for each pair of RF antenna loops of the plurality of pairs of antenna loops, the first antenna loop and the second antenna loop have substantially circular shapes.

15. The method of claim 2, wherein each respective RF receiver unit of the plurality of pairs of RF receiver units has a resonance frequency, the method further comprising:
automatically adjusting electrical parameters of the respective RF receiver units to adjust their resonance frequency.

16. The method of claim 2, wherein each respective RF receiver unit of the plurality of pairs of RF receiver units has a resonance frequency, the method further comprising:
automatically adjusting electrical parameters of each RF receiver unit of the plurality of pairs of RF receiver units to adjust the resonance frequency by moving a non-magnetic mechanical-movement device.

17. The method of claim 2, further comprising:
affixing the first antenna loop to the first major surface of the substrate; and
affixing the second antenna loop to the second major surface, wherein the the first antenna loop and the second antenna loop are substantially equal in size.

18. The method of claim 17, further comprising:
providing a second plurality of pairs of RF receiver units mounted on the substrate, wherein the second plurality of pairs of RF receiver units includes a third pair of RF receiver units and a fourth pairs of RF receiver units;
operatively coupling the third pair of RF receiver units to receive signals from the first antenna loop;
operatively coupling the fourth pair of RF receiver units to receive signals from the second antenna loop;
generating respective output signals from each of the first plurality of pairs of RF receiver units and each of the second plurality of pairs of RF receiver units; and
combining and decoding the respective output signals to generate an MRI image.

19. The method of claim 2, wherein for each pair of RF antenna loops in the plurality of pairs of RF antenna loops the method further includes:
affixing the first antenna loop to the first major surface of the substrate; and
affixing the second antenna loop to the second major surface of the substrate centered over the first antenna loop such that a center point of the first antenna loop and a center point of the second antenna loop are both located on a single line perpendicular to the first major surface.

20. The method of claim 2, wherein for each pair of RF antenna loops in the plurality of pairs of RF antenna loops the method further includes:
affixing first antenna loop to the first major surface of the substrate; and
affixing the second antenna loop to the first major surface centered relative to the first antenna loop such that a center point of the first antenna loop and a center point of the second antenna loop are located within two millimeters from one another, and wherein the first antenna loop and the first antenna loop are substantially coplanar and differing in circumference by at least ten percent.

21. The method of claim 2, wherein, for each pair of RF antenna loops of the plurality of pairs of antenna loops, the first antenna loop and the second antenna loop have substantially circular shapes.

* * * * *